(12) United States Patent
Tran et al.

(10) Patent No.: US 10,297,327 B2
(45) Date of Patent: May 21, 2019

(54) SENSING AMPLIFIER COMPRISING FULLY DEPLETED SILICON-ON-INSULATOR TRANSISTORS FOR READING A SELECTED FLASH MEMORY CELL IN AN ARRAY OF FLASH MEMORY CELLS

(71) Applicant: Silicon Storage Technology, Inc., San Jose, CA (US)

(72) Inventors: Hieu Van Tran, San Jose, CA (US); Anh Ly, San Jose, CA (US); Thuan Vu, San Jose, CA (US); Hung Quoc Nguyen, Fremont, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/952,155

(22) Filed: Apr. 12, 2018

(65) Prior Publication Data
US 2018/0233203 A1    Aug. 16, 2018

Related U.S. Application Data

(62) Division of application No. 14/875,533, filed on Oct. 5, 2015, now Pat. No. 9,972,395.

(51) Int. Cl.
| G11C 16/26 | (2006.01) |
| G11C 16/14 | (2006.01) |
| G11C 16/08 | (2006.01) |
| G11C 7/06 | (2006.01) |
| G11C 8/08 | (2006.01) |
| G11C 16/10 | (2006.01) |
| G11C 16/28 | (2006.01) |
| H01L 27/112 | (2006.01) |
| H01L 27/11582 | (2017.01) |
| H01L 49/02 | (2006.01) |

(52) U.S. Cl.
CPC .............. *G11C 16/26* (2013.01); *G11C 7/065* (2013.01); *G11C 8/08* (2013.01); *G11C 16/08* (2013.01); *G11C 16/10* (2013.01); *G11C 16/14* (2013.01); *G11C 16/28* (2013.01); *H01L 27/112* (2013.01); *H01L 27/11582* (2013.01); *H01L 28/00* (2013.01); *G11C 2216/04* (2013.01)

(58) Field of Classification Search
CPC ......... G11C 16/14; G11C 7/065; G11C 16/26; G11C 8/08; G11C 16/28; G11C 16/08; G11C 16/10; G11C 2216/04; H01L 27/112
See application file for complete search history.

(56) References Cited

U.S. PATENT DOCUMENTS

| 6,260,103 | B1 | 7/2001 | Alexis et al. |
| 7,447,073 | B2 | 11/2008 | Tran et al. |
| 7,521,760 | B2 | 4/2009 | Joshi et al. |
| 7,542,340 | B2 | 6/2009 | Fisch |

(Continued)

*Primary Examiner* — David Lam
(74) *Attorney, Agent, or Firm* — DLA Piper LLP US

(57) ABSTRACT

The present invention relates to a flash memory system comprising one or more sense amplifiers for reading data stored in flash memory cells. The sense amplifiers utilize fully depleted silicon-on-insulator transistors to minimize leakage. The fully depleted silicon-on-insulator transistors comprise one or more fully depleted silicon-on-insulator NMOS transistors and/or one or more fully depleted silicon-on-insulator PMOS transistors.

18 Claims, 23 Drawing Sheets

(56) References Cited

U.S. PATENT DOCUMENTS

| | | | |
|---|---|---|---|
| 7,995,398 B2* | 8/2011 | Wang | G11C 7/062 |
| | | | 365/185.21 |
| 8,659,948 B2 | 2/2014 | Okhonin | |
| 8,723,592 B2 | 5/2014 | Meijer et al. | |
| 9,159,400 B2 | 10/2015 | Ferrant | |
| 9,479,168 B2 | 10/2016 | Giraud | |
| 2002/0102774 A1 | 8/2002 | Kao | |
| 2003/0039143 A1 | 2/2003 | Ogane | |
| 2010/0208525 A1* | 8/2010 | Hanyu | G11C 16/28 |
| | | | 365/185.21 |
| 2011/0249499 A1* | 10/2011 | Fisch | G11C 7/12 |
| | | | 365/185.05 |
| 2014/0043886 A1* | 2/2014 | Wu | G11C 11/419 |
| | | | 365/148 |

\* cited by examiner

SENSING AMPLIFIER COMPRISING FULLY DEPLETED SILICON-ON-INSULATOR TRANSISTORS FOR READING A SELECTED FLASH MEMORY CELL IN AN ARRAY OF FLASH MEMORY CELLS

PRIORITY CLAIM

This application is a divisional of U.S. application Ser. No. 14/875,533, filed on Oct. 5, 2015, and titled "Row and Column Decoders Comprising Fully Depleted Silicon-On-Insulator Transistors for Use in Flash Memory Systems," which is incorporated herein by reference.

TECHNICAL FIELD

The present invention relates to a flash non-volatile memory system wherein a sense amplifier utilizes fully depleted silicon-on-insulator transistor design to minimize leakage and optimize performance.

BACKGROUND OF THE INVENTION

A prior art non-volatile memory cell 110 is shown in FIG. 1. The memory cell 110 comprises a semiconductor substrate 112 of a first conductivity type, such as P type. The substrate 112 has a surface on which there is formed a first region 114 (also known as the source line SL) of a second conductivity type, such as N type. A second region 116 (also known as the drain line) also of N type is formed on the surface of the substrate 112. Between the first region 114 and the second region 116 is a channel region 118. A bit line BL 120 is connected to the second region 116. A word line WL 122 is positioned above a first portion of the channel region 118 and is insulated therefrom. The word line 122 has little or no overlap with the second region 116. A floating gate FG 124 is over another portion of the channel region 118. The floating gate 124 is insulated therefrom, and is adjacent to the word line 122. The floating gate 124 is also adjacent to the first region 114. The floating gate 124 may overlap the first region 114 to provide coupling from the region 114 into the floating gate 124. A coupling gate CG (also known as control gate) 126 is over the floating gate 124 and is insulated therefrom. An erase gate EG 128 is over the first region 114 and is adjacent to the floating gate 124 and the coupling gate 126 and is insulated therefrom. The top corner of the floating gate 124 may point toward the inside corner of the T-shaped erase gate 128 to enhance erase efficiency. The erase gate 128 is also insulated from the first region 114. The cell 110 is more particularly described in U.S. Pat. No. 7,868,175 whose disclosure is incorporated herein by reference in its entirety.

One exemplary operation for erase and program of prior art non-volatile memory cell 110 is as follows. The cell 110 is erased, through a Fowler-Nordheim tunneling mechanism, by applying a high voltage on the erase gate 128 with other terminals equal to zero volt. Electrons tunnel from the floating gate 124 into the erase gate 128 causing the floating gate 124 to be positively charged, turning on the cell 110 in a read condition. The resulting cell erased state is known as '1' state. The cell 110 is programmed, through a source side hot electron programming mechanism, by applying a high voltage on the coupling gate 126, a high voltage on the source line 114, a medium voltage on the erase gate 128, and a programming current on the bit line 120. A portion of electrons flowing across the gap between the word line 122 and the floating gate 124 acquire enough energy to inject into the floating gate 124 causing the floating gate 124 to be negatively charged, turning off the cell 110 in read condition. The resulting cell programmed state is known as '0' state.

Exemplary voltages that can be used for the read, program, and erase operations in memory cell 110 is shown below in Table 1:

TABLE 1

| Operation | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2 V | 0 V | 0.6-2 V | 0 V/FLT | 0-2.6 V | 0-2.6 V | 0-2.6 V | 0-2.6 V | 0-2.6 V | 0 V | 0 V/FLT |
| Erase | 0 V | 0 V | 0 V | 0 V | 0 V | 0-2.6 V | 0-2.6 V | 11.5-12 V | 0-2.6 V | 0 V | 0 V |
| Program | 1 V | 0 V | 1 uA | Vinh | 10-11 V | 0-5 V | 0-2.6 V | 4.5-8 V | 0-2.6 V | 4.5-5 V | 0-1 V/FLT |

Note:
"FLT" means floating

For programming operation, the EG voltage can be applied much higher, e.g. 8V, than the SL voltage, e.g., 5V, to enhance the programming operation. In this case, the unselected CG program voltage is applied at a higher voltage (CG inhibit voltage), e.g. 6V, to reduce unwanted erase effect of the adjacent memory cells sharing the same EG gate of the selected memory cells.

Another set of exemplary voltages (when a negative voltage is available for read and program operations) that can be used for the read, program, and erase operations in memory cell 310 is shown below in Table 2:

TABLE 2

| Operation | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2 V | −0.5 V/0 V | 0.6-2 V | 0 V/FLT | 0-2.6 V | 0-2.6 V | 0-2.6 V | 0-2.6 V | 0-2.6 V | 0 V | 0 V/FLT |
| Erase | 0 V | 0 V | 0 V | 0 V | 0 V | 0 V-2.6 V | 0-2.6 V | 11.5-12 V | 0-2.6 V | 0 V | 0 V |
| Program | 1 V | −0.5 V/0 V | 1 uA | Vinh | 10-11 V | 0-2.6 V | 0-2.6 V | 4.5-5 V | 0-2.6 V | 4.5-5 V | 0-1 V/FLT |

Another set of exemplary voltages (when a negative voltage is available for read, program, and erase operations) that can be used for the read, program, and erase operations in memory cell 310 is shown below in Table 3:

TABLE 3

| Operation | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2 V | −0.5 V/0 V | 0.6-2 V | 0 V/FLT | 0-2.6 V | 0-2.6 V | 0-2.6 V | 0-2.6 V | 0-2.6 V | 0 V | 0 V/FLT |
| Erase | 0 V | −0.5 V/0 V | 0 V | 0 V | −(5-9) V | 0-2.6 V | 0-2.6 V | 9-8 V | 0-2.6 V | 0 V | 0 V |
| Program | 1 V | −0.5 V/0 V | 1 uA | Vinh | 8-9 V | 0-5 V | 0-2.6 V | 8-9 V | 0-2.6 V | 4.5-5 V | 0-1 V-FLT |

For programming operation, the EG voltage is applied much higher, e.g. 8-9V, than the SL voltage, e.g., 5V, to enhance the programming operation. In this case, the unselected CG program voltage is applied at a higher voltage (CG inhibit voltage), e.g. 5V, to reduce unwanted erase effects of the adjacent memory cells sharing the same EG gate of the selected memory cells.

Also known in the prior art are fully depleted silicon-on-insulator ("FDSOI") transistor designs as shown in FIGS. 2-4. The FDSOI advantages includes a back gate (with buried oxide as a gate oxide) to modulate the threshold voltage (forward body bias or reverse body bias), an ultra-thin un-doped channel that gives higher mobility and no random doping fluctuation. It has a ground plane on the back gate to adjust implant to adjust the threshold voltage. It also has a channel that is fully depleted to give better electrostatic control, lower drain-induced-barrier-lowering DIBL and short channel effect. It has minimum source and drain junction. Metal gate and channel length are also used to adjust threshold voltage.

FIG. 2 depicts FDSOI CMOS circuit cross section 210. FDSOI CMOS circuit 210 comprises silicon substrate 211, silicon insulators 216, FDSOI NMOS transistor 230, and FDSOI PMOS transistor 240.

FDSOI NMOS transistor 230 comprises gate 218, and source and drain 217. FDSOI NMOS transistor 230 further comprises p-well 212, buried oxide layer 213 (which is an insulator), and channel 215. Channel 215 is an undoped, fully depleted channel. During operation, buried oxide layer 213 minimizes any leakage out of channel 214. FDSOI NMOS transistor 230 further comprises p-well back gate terminal 219, which can be used to add a bias to p-well 212 such as to adjust the threshold voltage Vt of the NMOS 230.

FDSOI PMOS transistor 240 comprises gate 228, and source and drain 227. FDSOI PMOS transistor 240 further comprises n-well 222, buried oxide layer 223 (which is an insulator), and channel 225. Channel 225 is an undoped, fully depleted channel. During operation, buried oxide layer 223 minimizes any leakage out of channel 225. FDSOI PMOS transistor 240 further comprises n-well back gate terminal 229, which can be used to add a bias to n-well 222 such as to adjust the threshold voltage Vt of the PMOS 240.

FIG. 3 depicts FDSOI CMOS circuit cross section 310. FDSOI CMOS 310 circuit comprises silicon substrate 311, silicon insulators 316, FDSOI NMOS transistor 330, and FDSOI PMOS transistor 340.

FDSOI NMOS transistor 330 comprises gate 318, and source and drain 317. FDSOI NMOS transistor 330 further comprises n-well 312, buried oxide layer 313 (which is an insulator), and channel 315. Channel 315 is an undoped, fully depleted channel. During operation, buried oxide layer 313 minimizes any leakage out of channel 315. FDSOI NMOS transistor 330 further comprises n-well back gate terminal 319, which can be used to add a bias to n-well 312 such as to adjust the threshold voltage Vt of the NMOS 330.

FDSOI PMOS transistor 340 comprises gate 328, and source and drain 327. FDSOI PMOS transistor 340 further comprises p-well 312, buried oxide layer 323 (which is an insulator), and channel 325. Channel 325 is an undoped, fully depleted channel. During operation, buried oxide layer 323 minimizes any leakage out of channel 325. FDSOI PMOS transistor 340 further comprises p-well back gate terminal 329, which can be used to add a bias to p-well 322 such as to adjust the threshold voltage Vt of the PMOS 340.

FIG. 4 depicts FDSOI and bulk CMOS hybrid MOS circuit cross section 410. Bulk CMOS refers to standard PMOS and NMOS transistor on bulk silicon. Hybrid MOS circuit 410 comprises silicon substrate 411, silicon insulators 416, FDSOI NMOS transistor 430 and NMOS transistor 440. NMOS transistor 440 is a traditional NMOS transistor and not an FDSOI NMOS transistor.

FDSOI NMOS transistor 430 comprises gate 418, and source and drain 417. FDSOI NMOS transistor 430 further comprises p-well 412, buried oxide layer 413 (which is an insulator), and channel 415. Channel 415 is an undoped, fully depleted channel. During operation, buried oxide layer 413 minimizes any leakage out of channel 415. FDSOI NMOS transistor 430 further comprises p-well back gate terminal 419, which can be used to add a bias to p-well 412 such as to adjust the threshold voltage Vt of the NMOS 430.

NMOS transistor 440 comprises gate 428, and source and drain 427. NMOS transistor 440 further comprises p-well bulk 422 and doped channel 423. NMOS transistor 440 further comprises p-well bulk terminal 429, which can be used to add a bias to p-well bulk 422.

To date, fully depleted silicon-on-insulator transistor designs have not been used in flash memory systems. What is needed is a flash memory system that utilizes fully depleted silicon-on-insulator transistor designs. What is further needed is a partitioned flash memory chip that comprises a bulk region and an FDSOI region to maximize area and minimize leakage.

SUMMARY OF THE INVENTION

In the embodiments described below, a flash non-volatile memory system comprises a sense amplifier that utilizes fully depleted silicon-on-insulator transistors to minimize leakage and optimize performance.

DETAILED DESCRIPTION OF THE PREFERRED EMBODIMENTS

Figure 5:
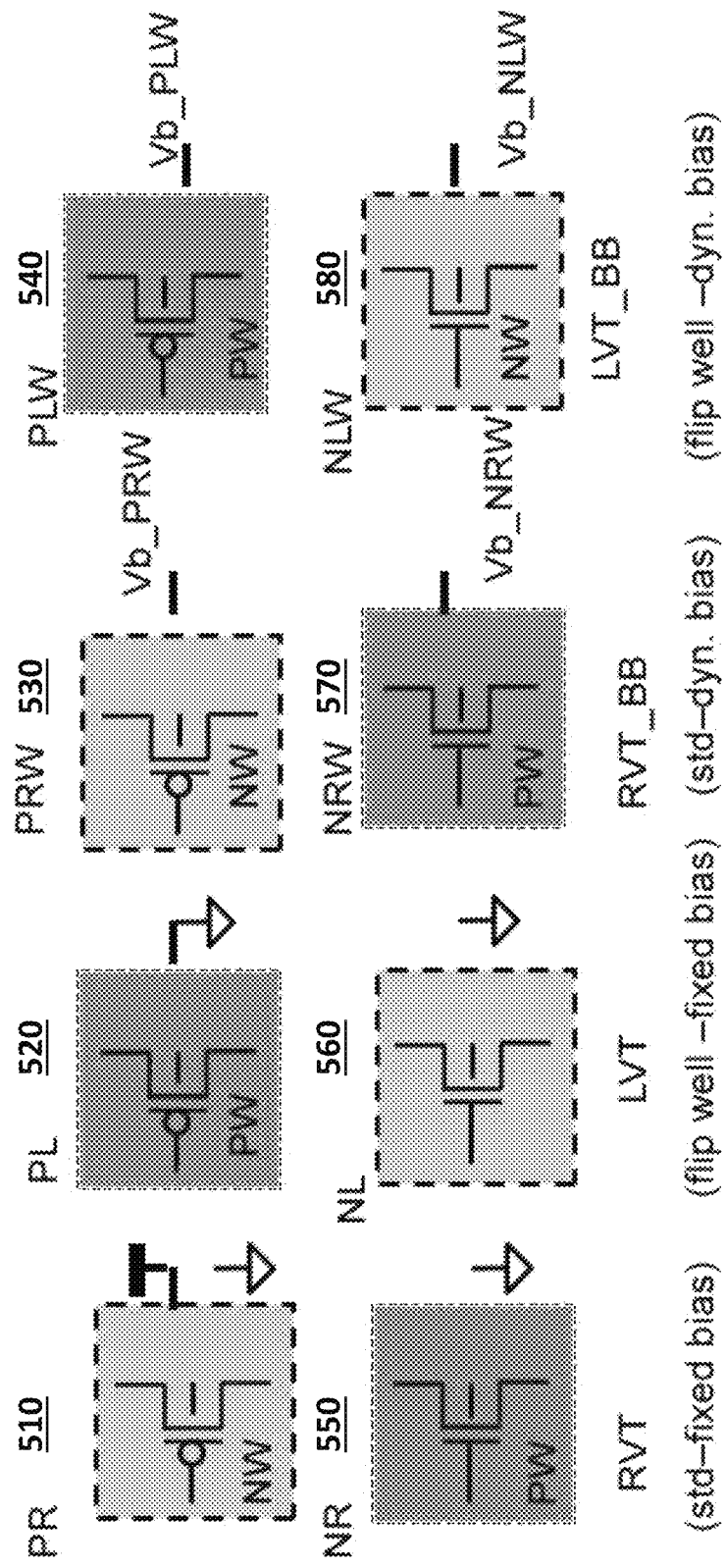
FIG. 5 depict various types of FDSOI NMOS and PMOS transistors used in the embodiments.

FIG. 5 depicts eight FDSOI transistor types that are used in the embodiments described herein.

Standard fixed bias FDSOI MOS transistors includes PMOS transistor 510 and NMOS transistor 550. FDSOI PMOS transistor 510 comprises an n-well that is biased to Vdd power supply and optionally to ground, in this case transistor channel length is modified to have similar threshold voltage level. FDSOI NMOS transistor 550 comprises a p-well that is biased to ground. The PMOS 510 and NMOS 550 are regular threshold voltage devices.

Flipped well fixed bias FDSOI MOS transistors includes PMOS transistor 520 and NMOS transistor 560. FDSOI PMOS transistor 520 comprises a p-well that is biased to ground. FDSOI NMOS transistor 560 comprises an n-well that is biased to ground. The PMOS 520 and NMOS 560 are low threshold voltage devices, i.e., its threshold voltage is lower than that of the PMOS 510 and NMOS 550.

Standard dynamic bias FDSOI MOS transistors includes PMOS transistor 530 and NMOS transistor 570. FDSOI PMOS transistor 530 comprises an n-well that is biased to a dynamic voltage source Vb_PRW. FDSOI NMOS transistor 570 comprises a p-well that is biased to a dynamic voltage source Vb_NRW. The dynamic voltage source is used to forward body (well) bias FBB or reverse body bias RBB to optimize performance. For the PMOS 530 dynamic voltage source Vb_PRW varies to positive voltage (e.g., up to 3V) for RBB and varies to negative voltage (e.g., up to −0.5V) for FBB. For the NMOS 570 dynamic voltage source Vb_NRW varies to positive voltage (e.g., 0V to 3V) for FBB and varies to negative voltage (e.g., 0V to −3V) for RBB. A deep nwell is needed to isolate the pwell from p substrate to allow pwell to be biased at a high level, e.g. 3V or −3V.

Flipped well dynamic bias FDSOI MOS transistors includes PMOS transistor 540 and NMOS transistor 580. FDSOI PMOS transistor 540 comprises a p-well that is biased to a dynamic voltage source Vb_PLW. FDSOI NMOS transistor 580 comprises an n-well that is biased to a dynamic voltage source Vb_NLW. For the PMOS 540 dynamic voltage source Vb_PLW varies to positive voltage (e.g., 0V to 3V) for RBB and varies to negative voltage (e.g., 0V to −3V) for FBB. For the NMOS 580 dynamic voltage source Vb_NLW varies to positive voltage (e.g., 0V to 3V) for FBB and varies to negative voltage (e.g., 0V to −0.5V) for RBB. A deep nwell is needed to isolate the pwell from p substrate to allow pwell to be biased at a high level, e.g. 3V or −3V.

In the embodiments that follow, one or more the eight types of FDSOI transistors shown in FIG. 5 are used in a flash memory system.

Figure 1:
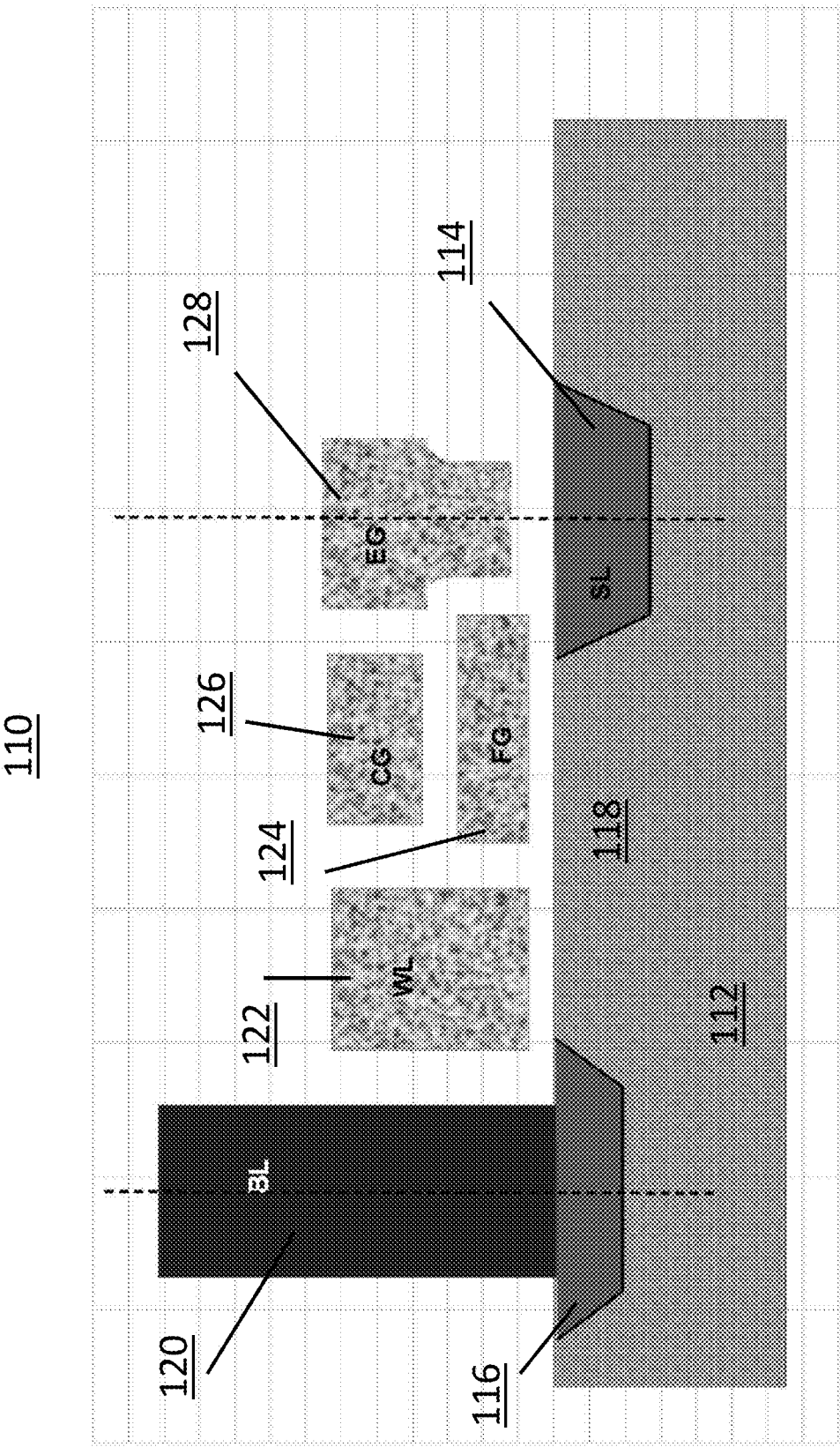
FIG. 1 is a cross-sectional view of a non-volatile memory cell of the prior art.
Figure 2:
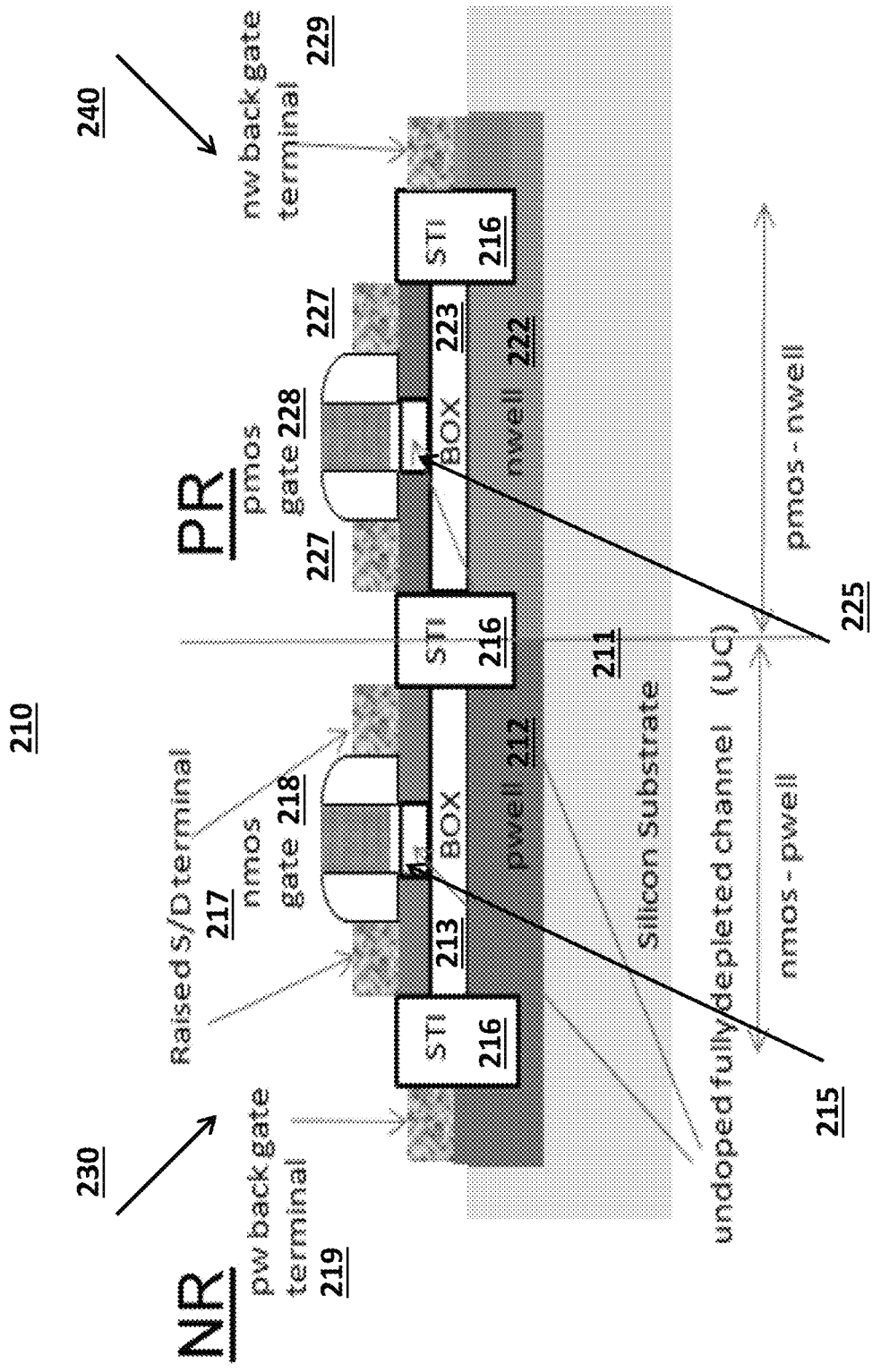
FIG. 2 is a cross-sectional view of a FDSOI CMOS circuit of the prior art.
Figure 3:
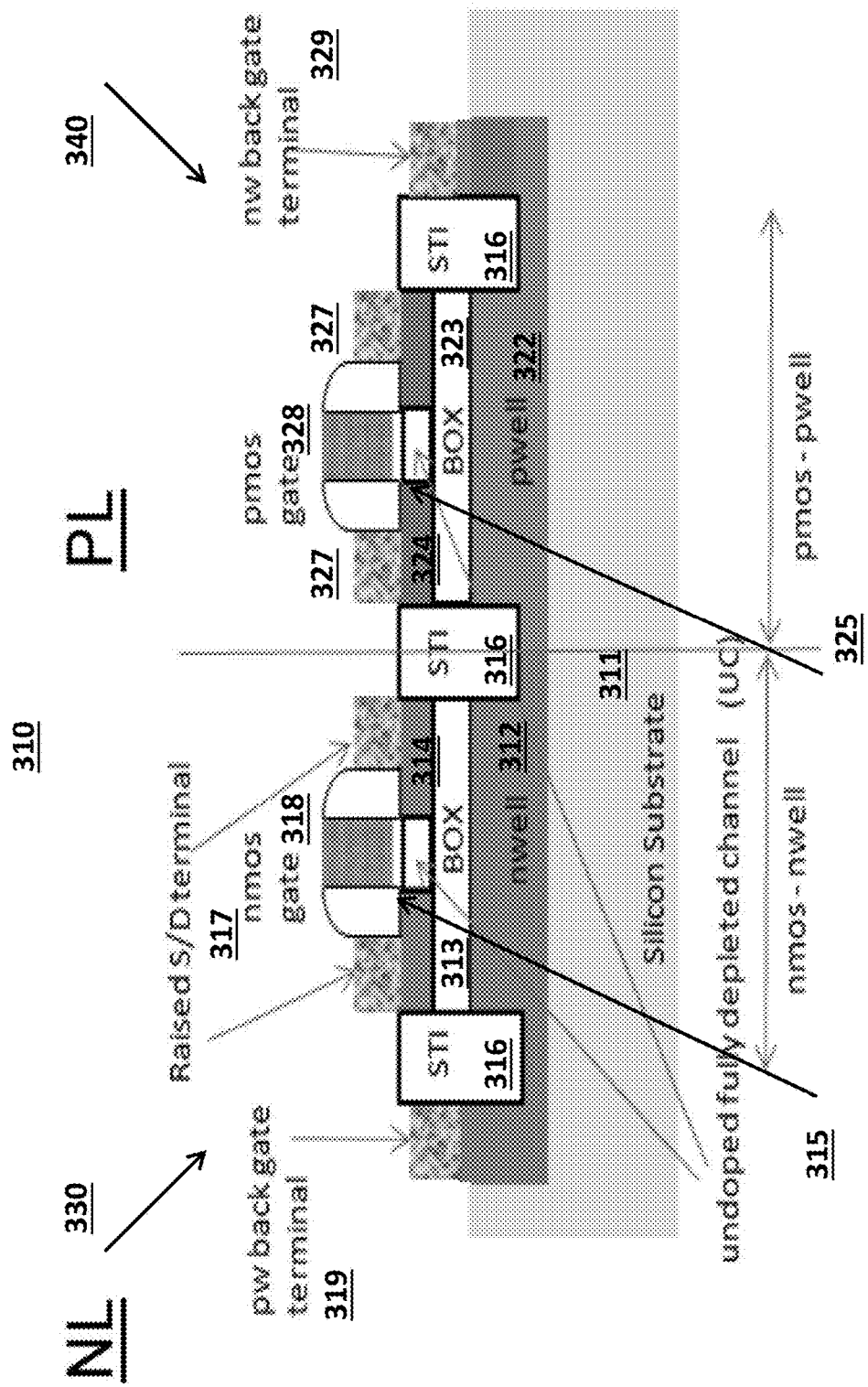
FIG. 3 is a cross-sectional view of a FDSOI CMOS circuit of the prior art.
Figure 4:
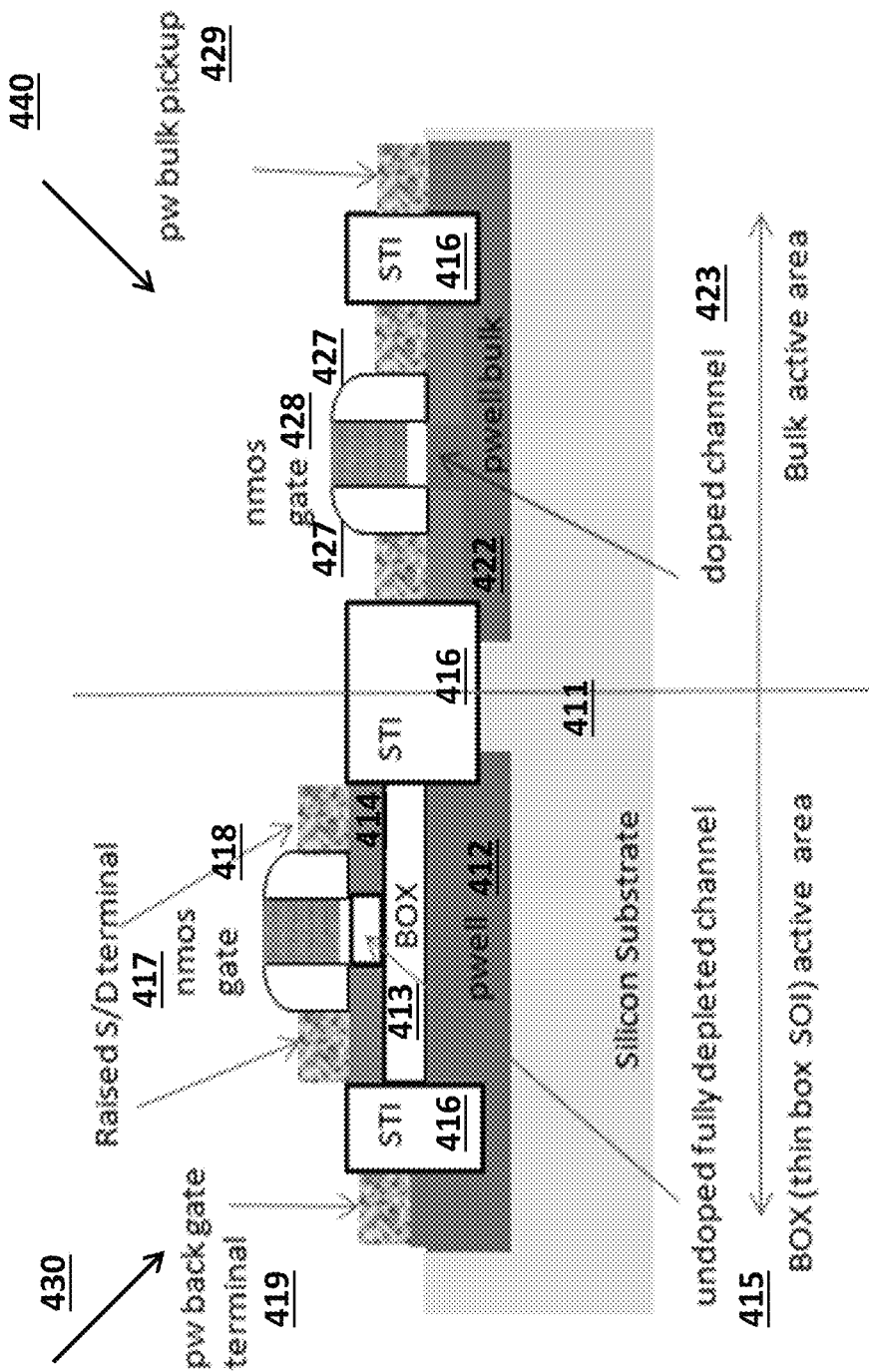
FIG. 4 is a cross-sectional view of a FDSOI CMOS circuit of the prior art.
Figure 6:
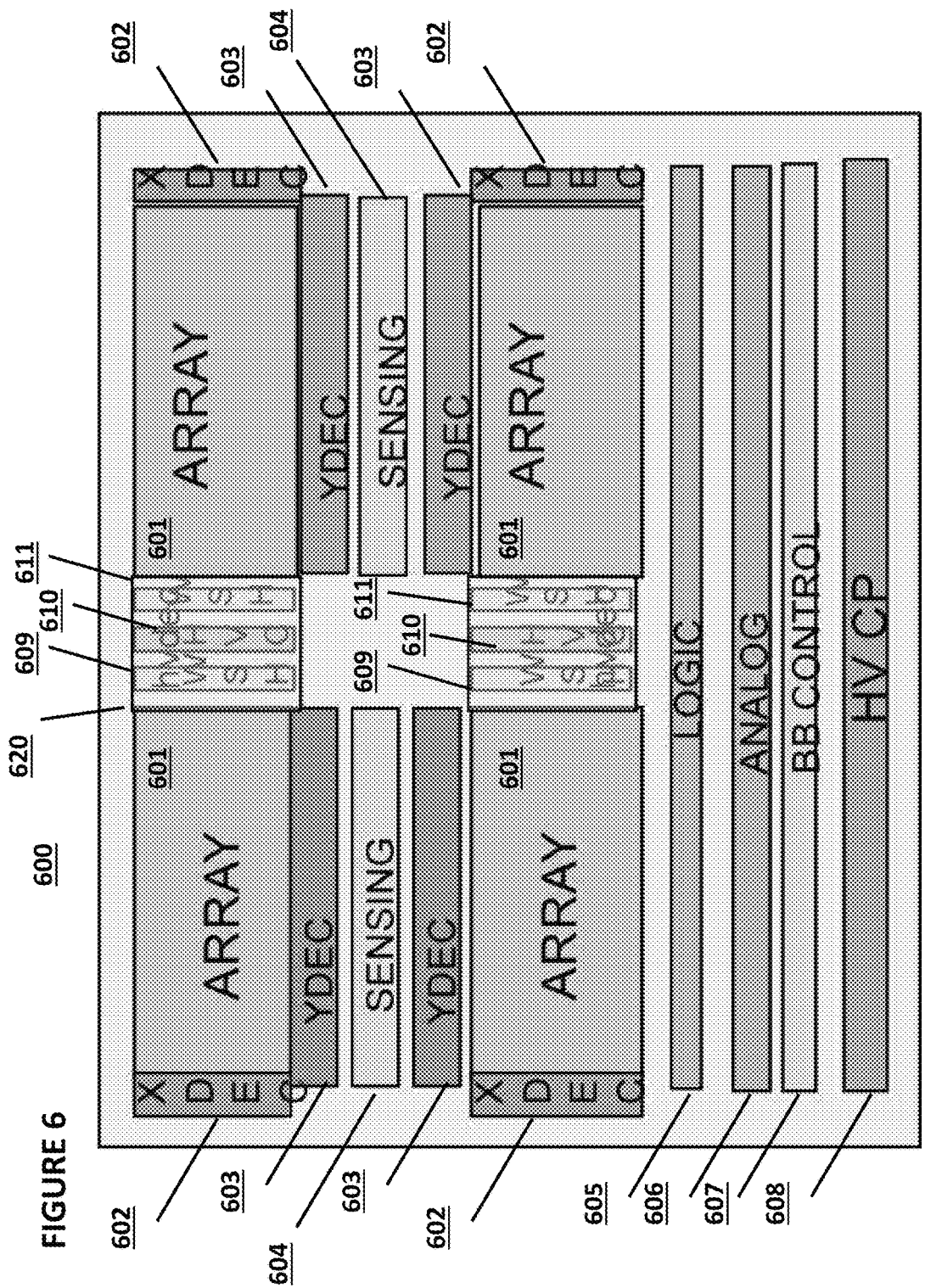
FIG. 6 depicts a die used in the embodiments.

FIG. 6 depicts an embodiment of an architecture for a flash memory system comprising die 600. Die 600 comprises: flash memory arrays 601 comprising rows and columns of memory cells of the type described previously as memory cell 110 in FIG. 1; row decoder circuits 602 used to access the rows in flash memory arrays 601 to be read from or written to; column decoder circuits 603 used to access bytes in flash memory arrays 601 to be read from or written to; sensing circuits 604 used to read data from flash memory arrays 601; high voltage (HV) decoder 620 consisting of HV decoding block 610 and HV passing blocks 609 and 611 for delivering voltages and biases needed for non-volatile operation for the flash memory arrays 601; control logic 605 for providing various control functions, such as redundancy and built-in self-testing; analog circuit 606; bulk bias control 607 for controlling the voltage of the bulk (well) regions of transistors; high voltage charge pump circuit 608 used to provide increased voltages for program and erase operations for flash memory arrays 601. The chip partition for the blocks for FDSOI vs. Bulk CMOS region to achieve optimal performance is as following.

Row decoder 602: Standard Vt, Flipped Well Vt, Dynamic Vt FDSOI

Column decoder 603: Standard Vt, Flipped Well Vt, Dynamic Vt FDSOI

Sensing circuits 604: Standard Vt, Flipped Well Vt, Dynamic Vt FDSOI

Control logic 605: Standard Vt, Flipped Well Vt FDSOI

Analog circuit 606: Standard Vt, Flipped Well Vt, Dynamic Vt FDSOI

Bulk bias control circuit 607: Standard Vt, Flipped Well Vt, Dynamic Vt FDSOI

Figure 7:
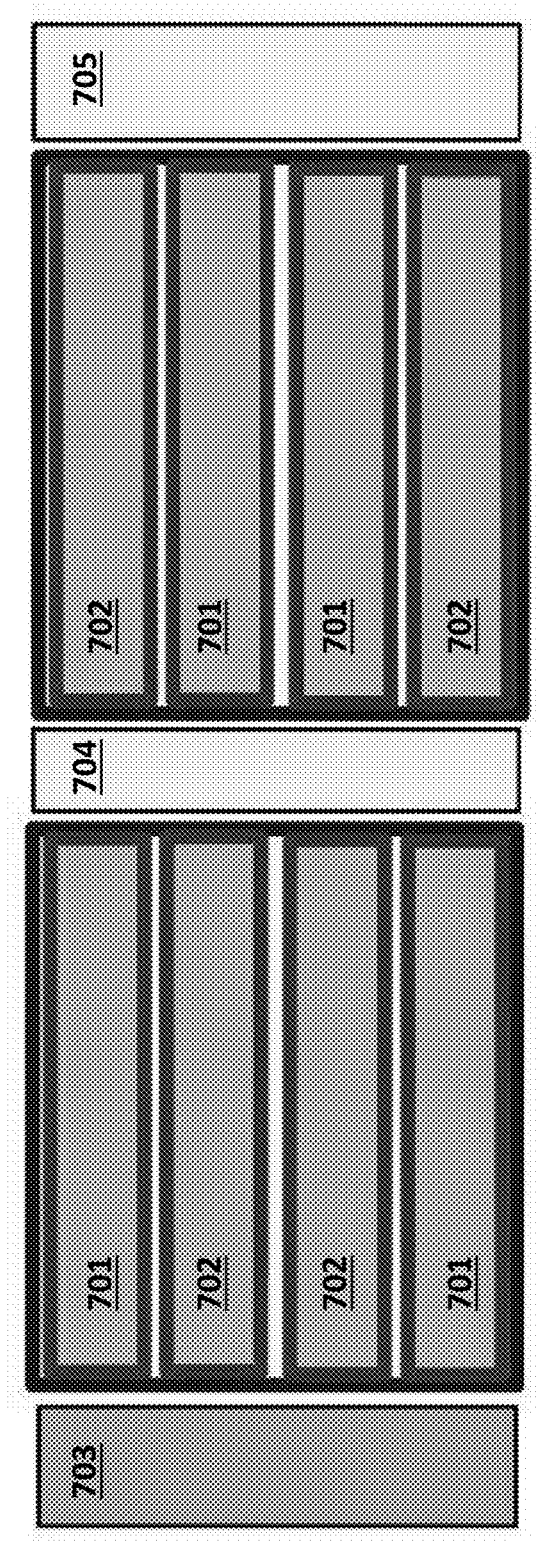
FIG. 7 depicts basic components of an array used in the embodiments.

HV chargepump circuit 608: Bulk CMOS and FDSOI hybrid, FDSOI region includes Standard Vt, Flipped Well Vt, Dynamic Vt FDSOIHV decoder circuit 620: Bulk CMOS and FDSOI hybrid, FDSOI region includes Standard Vt, Flipped Well Vt, Dynamic Vt FDSOI An embodiment of array 601 is shown in FIG. 7. Array 601 comprises a first plurality of subarrays 701 and a second plurality of subarrays 702. Here, the first plurality of subarrays 701 has a bias voltage applied to its p-well and n-well areas (to achieve higher performance), and the second plurality of subarrays 702 does not have a bias voltage applied to its p-well and n-well areas (to achieve less leakage). Array 601 further comprises row decoder 703, high voltage subarray source 704, and high voltage decoder 705.

Figure 8:
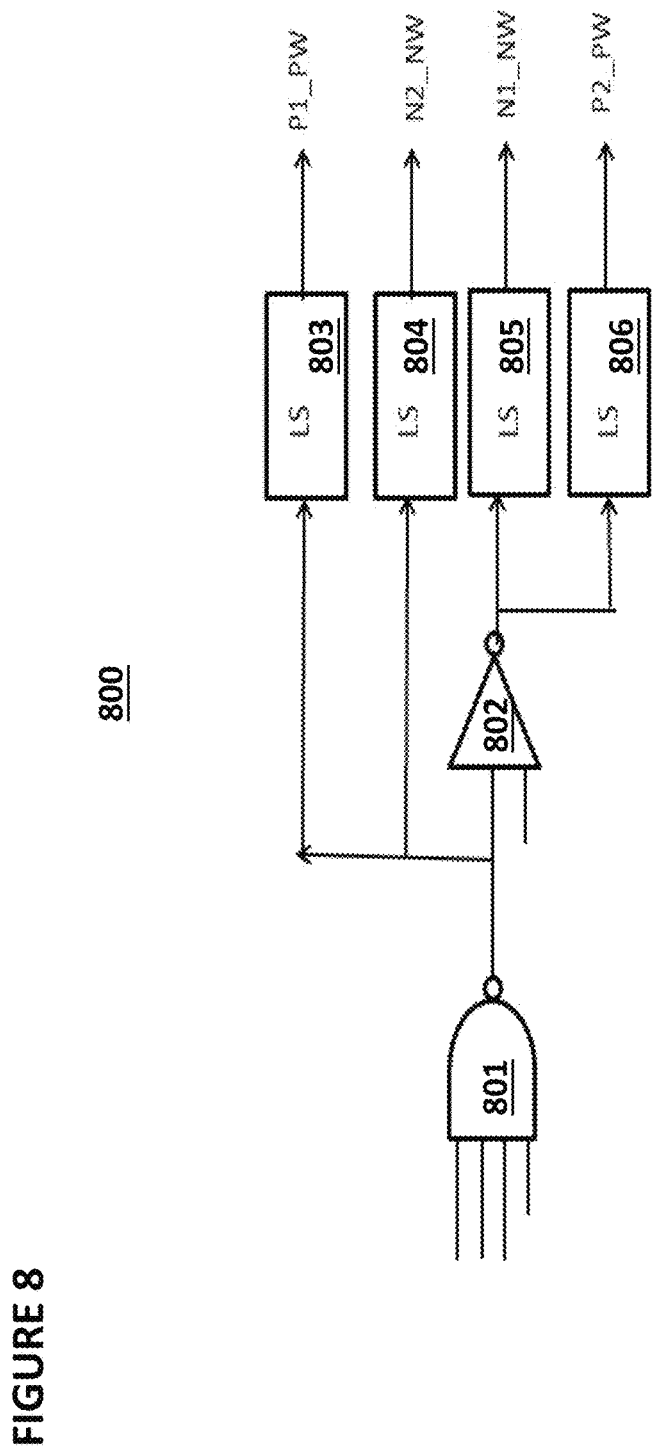
FIG. 8 depicts a decoder to generate different voltages for use by the embodiments.

FIG. 8 depicts decoder 800 for generating bias control voltages P1_PW, P2_PW, N1_NW, and N2_NW, which are used in the embodiments that follow. Decoder 800 comprises NAND gate 801, inverter 802, and programmable voltage sources 803, 804, 805, and 806, as shown.

Figure 9:
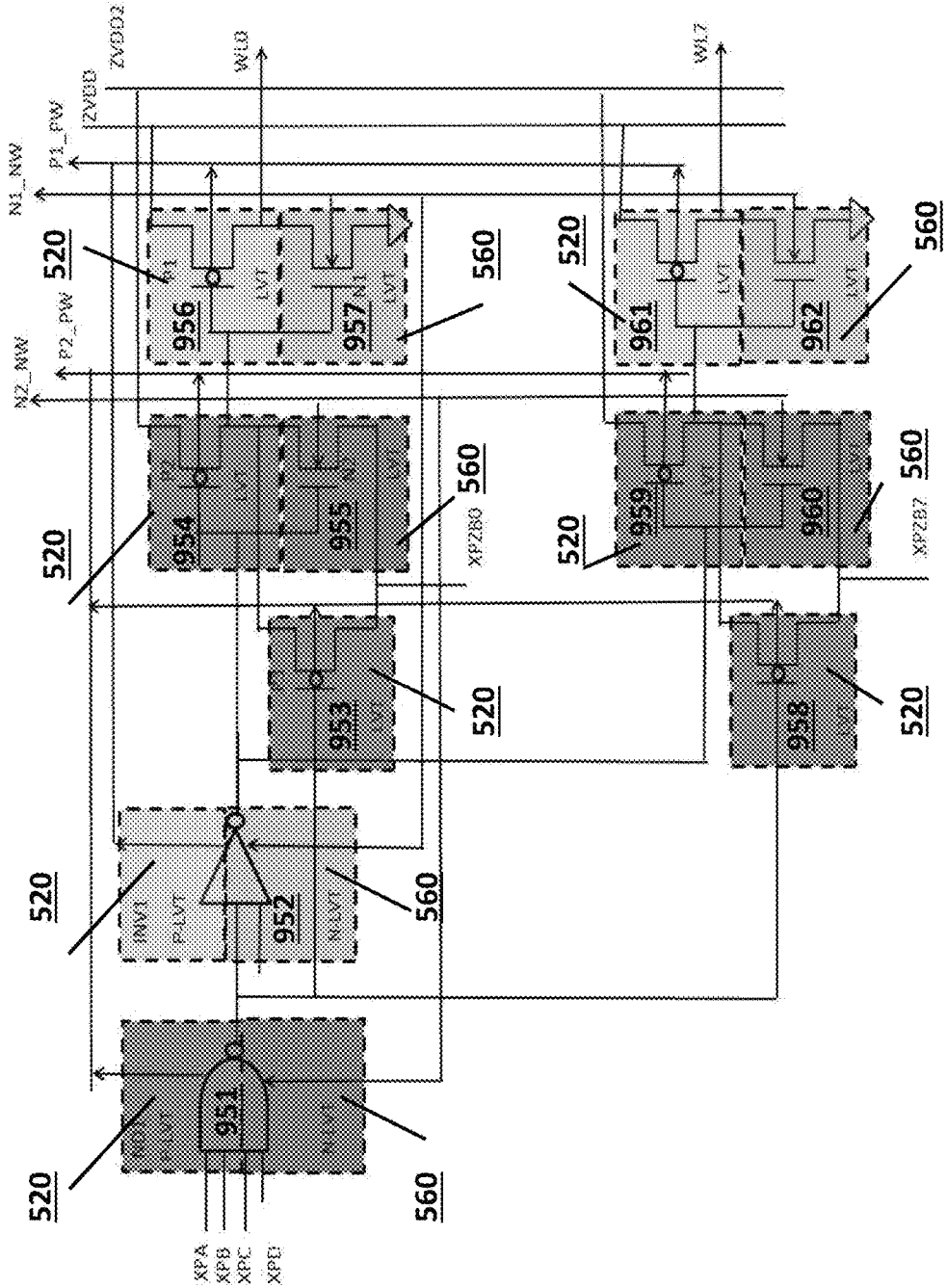
FIG. 9 depicts an embodiment of a row decoder.

FIG. 9 depicts row decoder 900. Row decoder 900 comprises NAND gate 951, inverter 952, as well as PMOS transistors 953, 954, 956, 958, 959, and 961 and NMOS transistors 955, 957, 960, and 962 as shown. The NAND gate 951 and inverter 952 serves as row address decoder to decoding address signal XPA-D for row address decoding. The PMOS 956 and NMOS 957 serves as row driver with strong strength to drive pre-determined signal ZVDD into wordlines WL0-7 of memory cell. The PMOS 954, PMOS 953, and NMOS 955 serves dual functions, as a row pre-driver and decoding address signals XPZB0-7.

NAND gate 951 comprises transistors of type FDSOI PMOS 520 with the p-well biased to P2_PW and transistors of type FDSOI NMOS 560 with the n-well biased to N2_NW.

Inverter 952 comprises transistors of type FDSOI PMOS 520 with the p-well biased to P1_PW and transistors of type FDSOI NMOS 560 with the n-well biased to N1_NW.

PMOS transistors 953, 954, 958, and 959 are transistors of type FDSOI PMOS 520 with the p-well biased to P2_PW. PMOS transistors 956 and 961 are transistors of type FDSOI PMOS 520 with the p-well biased to P1_PW.

NMOS transistors 955 and 960 are transistors of type FDSOI NMOS 560 with the n-well biased to N2_NW. NMOS transistors 957 and 962 are transistors of type FDSOI NMOS 560 with the n-well biased to N1_NW. The well bias levels for P1_PW/P2_PW/N1_NW/N2_NW are such that using forward bias FBB for speed performance and reverse bias RBB to reduce leakage.

Figure 10:
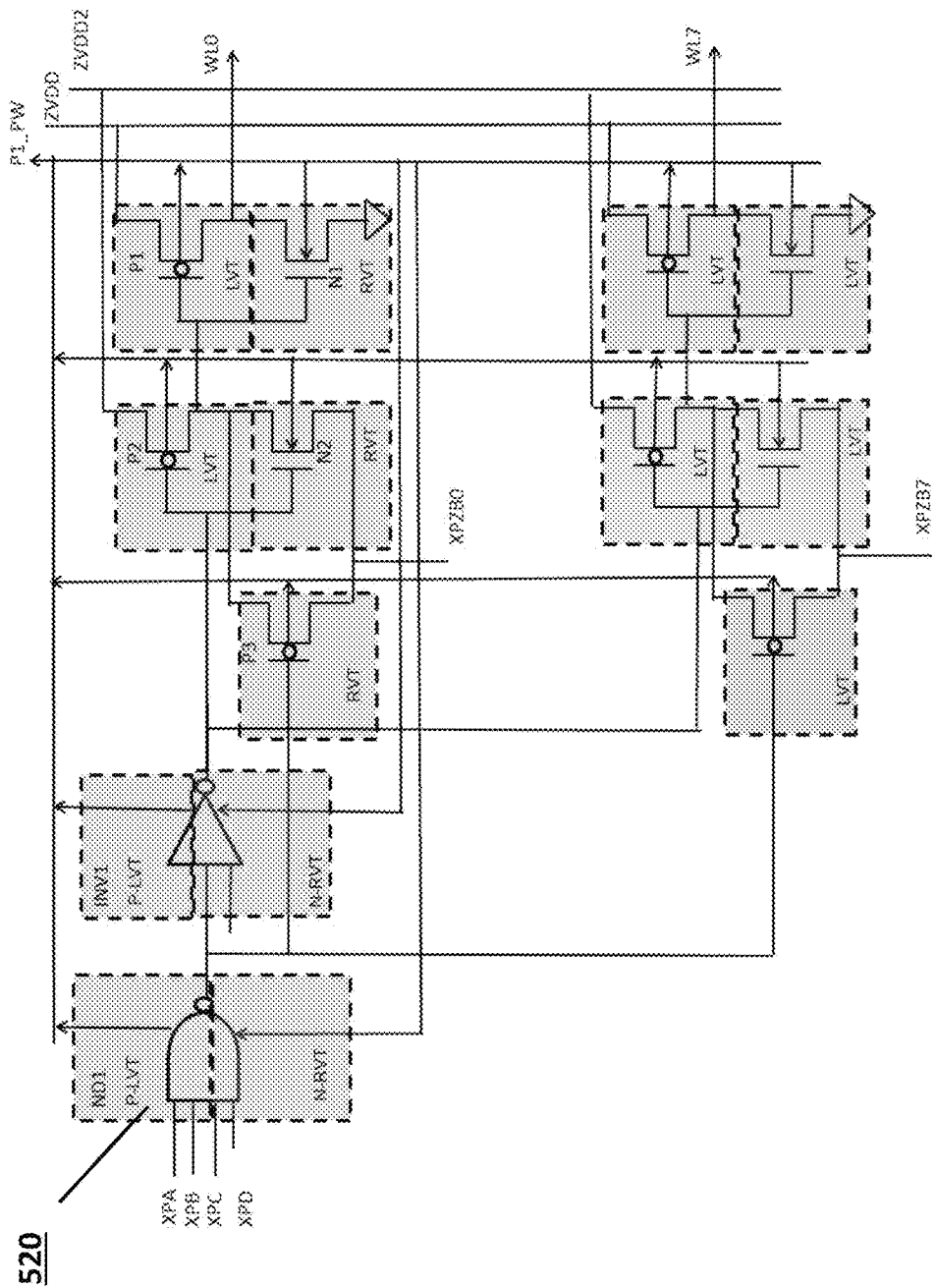
FIG. 10 depicts another embodiment of a row decoder.
Figure 11:
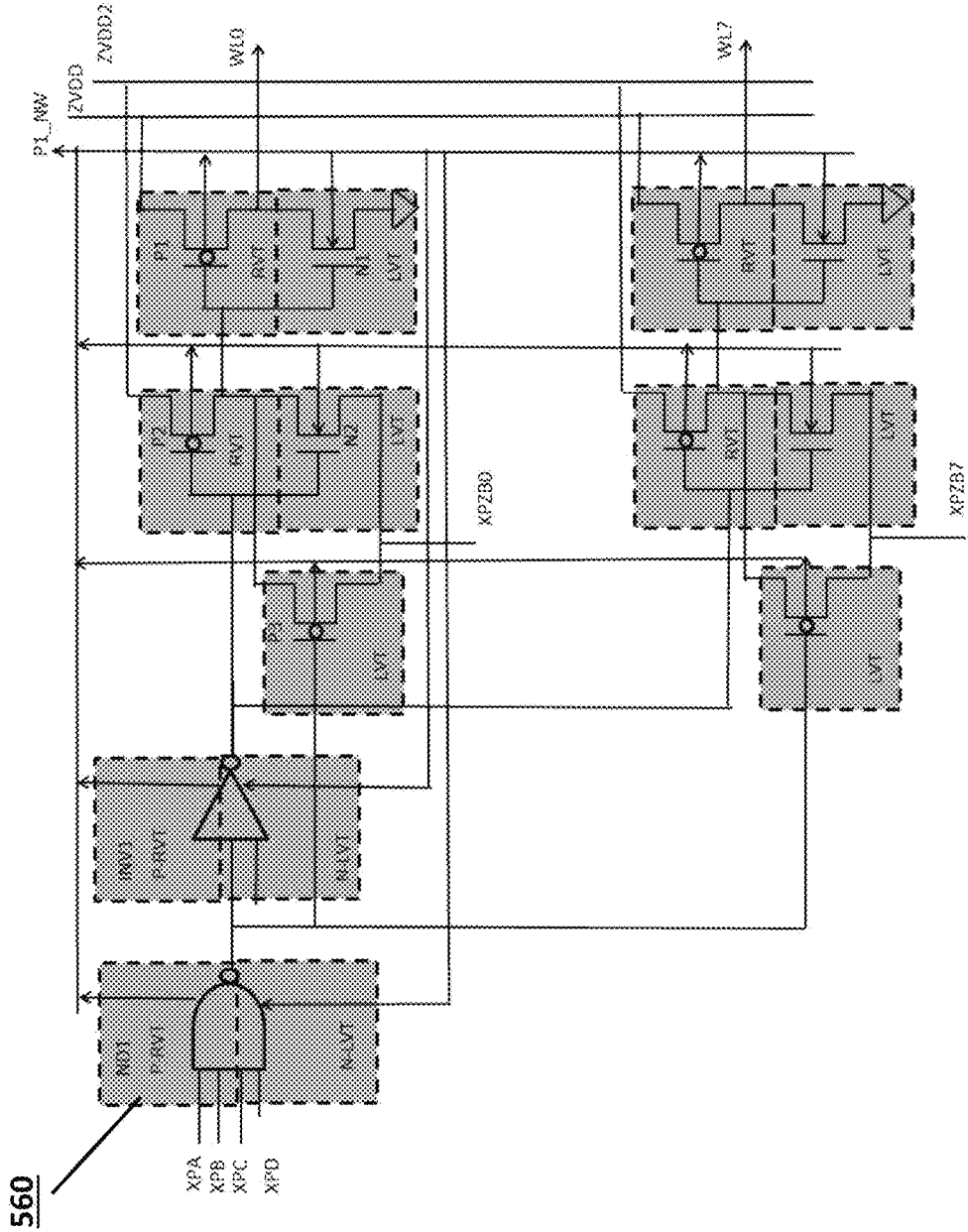
FIG. 11 depicts another embodiment of a row decoder.
Figure 12:
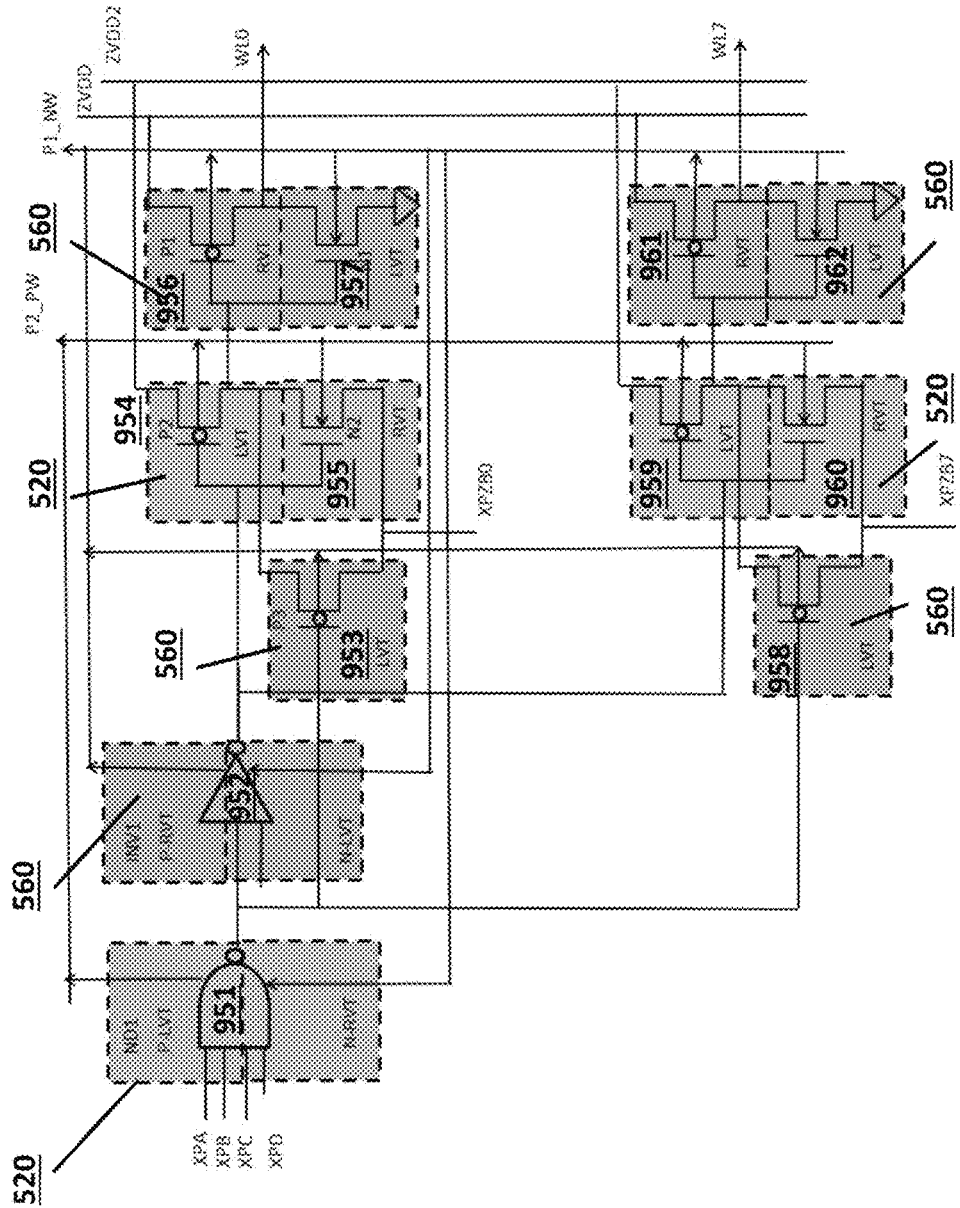
FIG. 12 depicts another embodiment of a row decoder.
Figure 13:
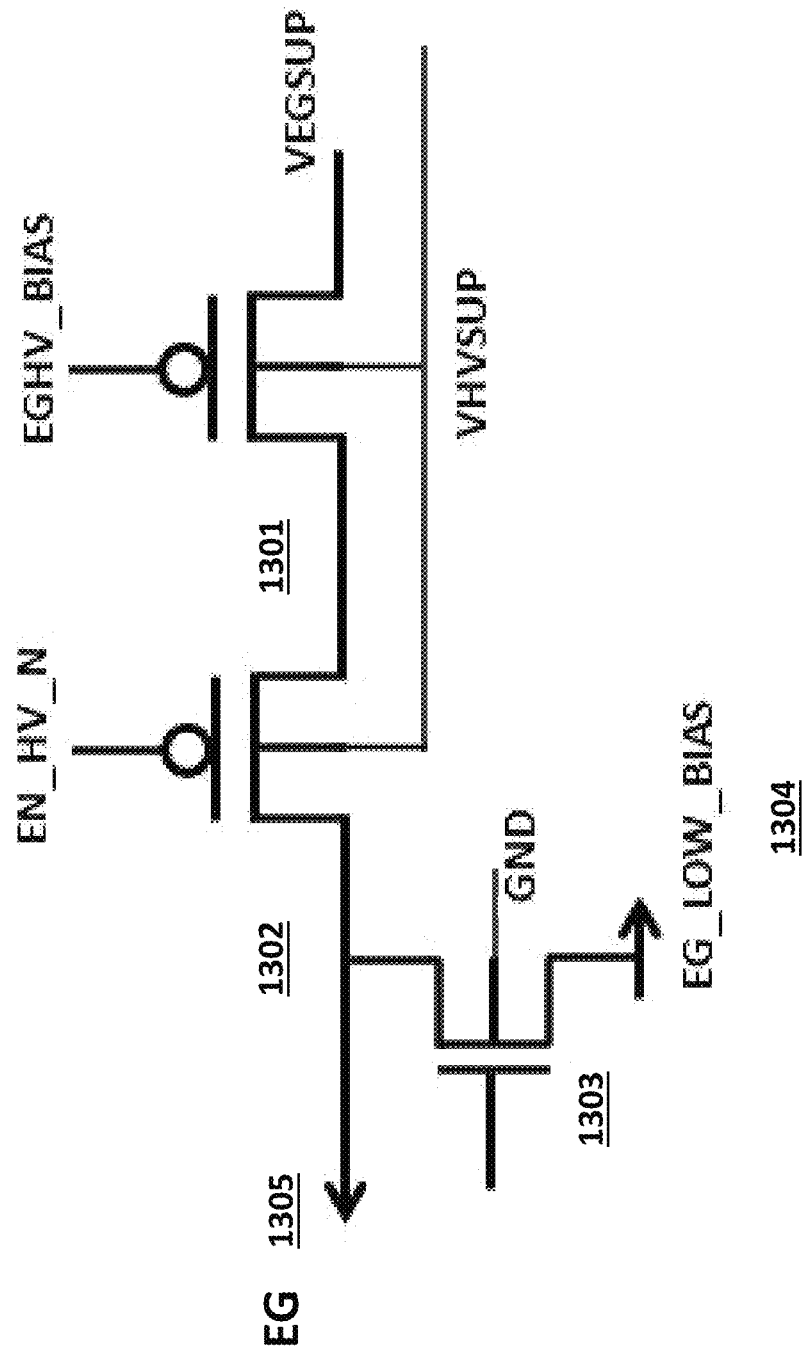
FIG. 13 depicts an embodiment of an erase gate decoder.

FIG. 10 depicts row decoder 1000. Row decoder 1000 is structurally identical to row decoder 900, except that all of the transistors are of type FDSOI PMOS 520, with the p-well biased to P1_PW. The well bias levels for P1_PW is such that using forward bias FBB for speed performance and reverse bias RBB to reduce leakage FIG. 11 depicts row decoder 1100. Row decoder 1100 is structurally identical to row decoder 900, except that all of the transistors are of type FDSOI NMOS 560, with the n-well biased to P1_NW. The well bias levels for P1_NW is such that using forward bias FBB for speed performance and reverse bias RBB to reduce leakage FIG. 12 depicts row decoder 1200. Row decoder 1200 is structurally identical to row decoder 900, except that: NAND gate 951 comprises transistors of type FDSOI NMOS 550 with the p-well biased to P2_PW; inverter 952 comprises transistors of type FDSOI NMOS 560 with the n-well biased to P1_NW; PMOS transistors 953, 956, 958, and 961 are transistors of type FDSOI PMOS 510 with the p-well biased to P1_NW; PMOS transistors 954 and 959 are transistors of type FDSOI PMOS 520 with the p-well biased to P2_PW; NMOS transistors 955 and 960 are transistors of type FDSOI NMOS 510, with the n-well biased to P2_PW; and NMOS transistors 957 and 962 are transistors of type FDSOI NMOS 560 of with the n-well biased to P1_NW. The well bias levels for P2_PW/P1_NW are such that using forward bias FBB for speed performance and reverse bias RBB to reduce leakage FIG. 13 depicts erase gate decoder 1300. No FDSOI transistors are used in erase gate decoder 1300 in this example but of bulk CMOS types. HV PMOS 1301 to control current from HV supply VEGSUP, HV PMOS 1302 is used as address decoding. HV NMOS 1303 is used as pull down device to pull EG 1305 to a low level or as a passing transistor to pass bias level EG_LOW_BIAS 1304 into the EG terminal.

Figure 14:
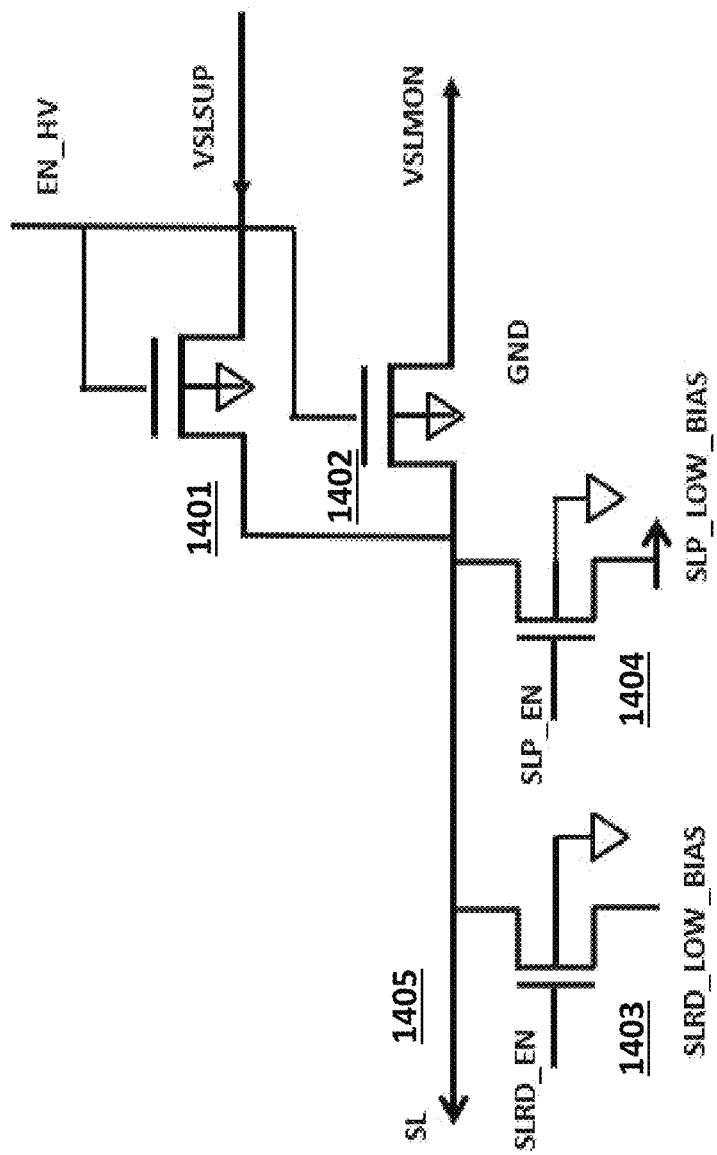
FIG. 14 depicts an embodiment of a source line decoder.

FIG. 14 depicts source line decoder 1400. No FDSOI transistors are used in source line decoder 1400 in this example but of bulk CMOS types. NMOS 1401 is used to pass SL supply VSLSUP, NMOS 1402 is used to measure (monitor) voltage on SL 1405, NMOS 1403 is used to pass a low bias level SLRD_LOW_BIAS in read or standby, NMOS 1404 is used to pass a low bias level SLP_LOW_BIAS in program.

Figure 15:
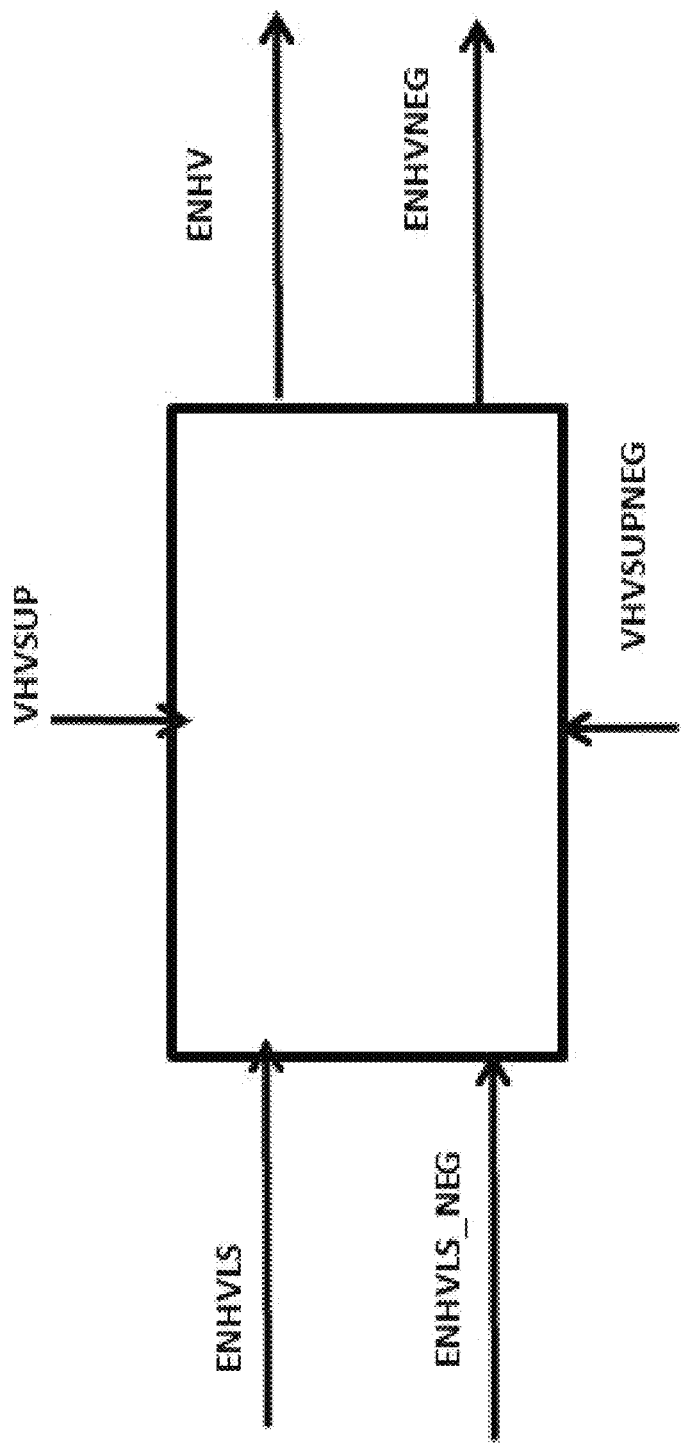
FIG. 15 depicts an embodiment of a high voltage logic selector circuit.

FIG. 15 depicts high voltage circuit selector 1500 that once it is enabled will output positive high voltage level on ENHV and/or negative high voltage level on ENHVNEG. No FDSOI transistors are used in high voltage logic selector 1500 in this example.

Figure 16:
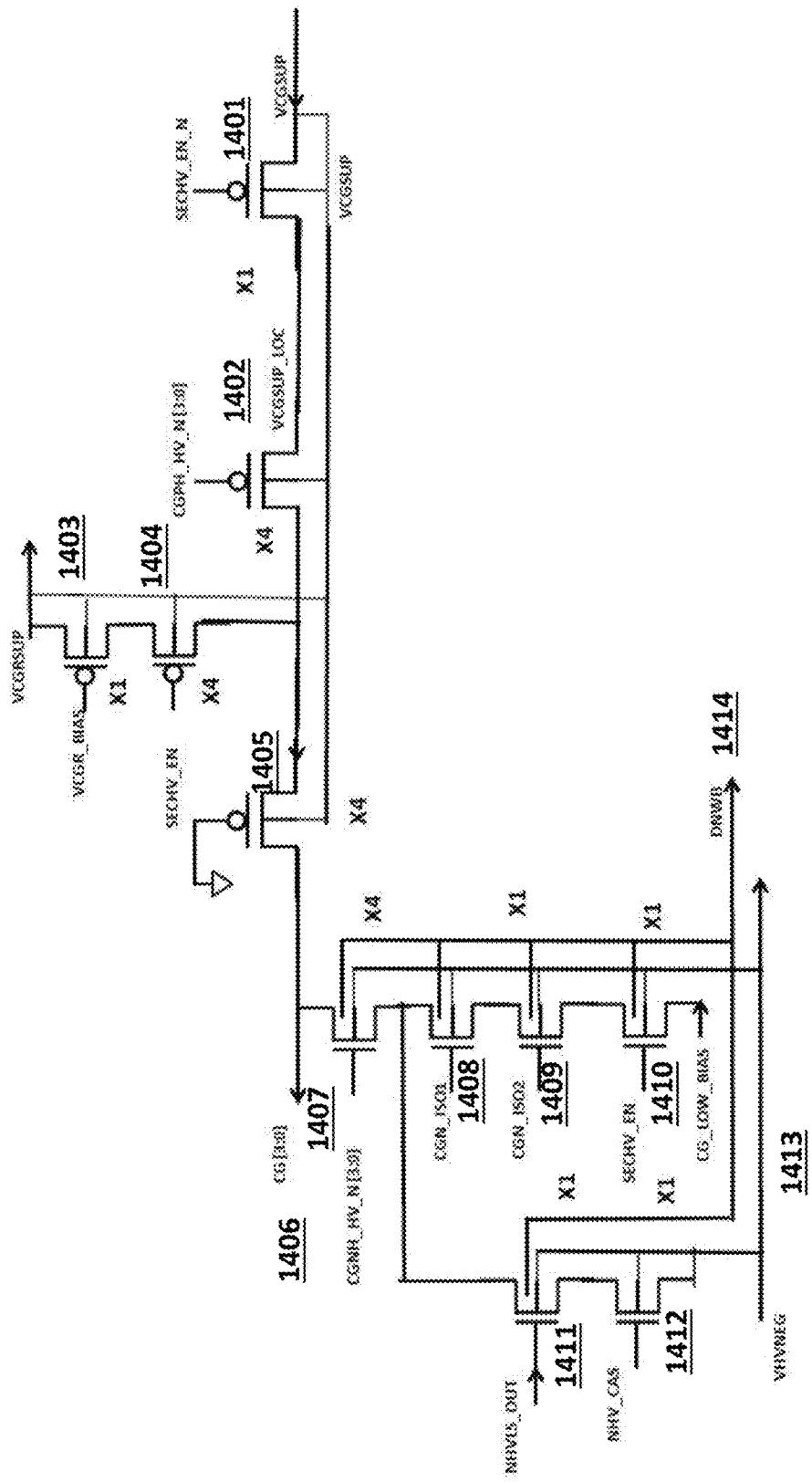
FIG. 16 depicts an embodiment of a coupling gate decoder.

FIG. 16 depicts coupling gate decoder 1600. No FDSOI transistors are used in coupling gate decoder 1600 1400 in this example but of bulk CMOS types. HV PMOS 1401 is used to pass CG supply, HV PMOS 1402 is as address decoding, PMOS 1403 is used to control current from CG read supply VCGRSUP, HV PMOS 1404 is used to pass CG read supply. PMOS 1405 is used to isolate negative voltage level. NMOS 1407 is used as address decoding, NMOS 1408 and 1409 are used as for negative voltage isolation, NMOS 1410 is used to pass a bias level CG_LOW_BIAS into CG 1406. NMOS 1411 is used to pass negative voltage supply VHVNEG, NMOS 1412 is used as negative cascoding.

Figure 17:
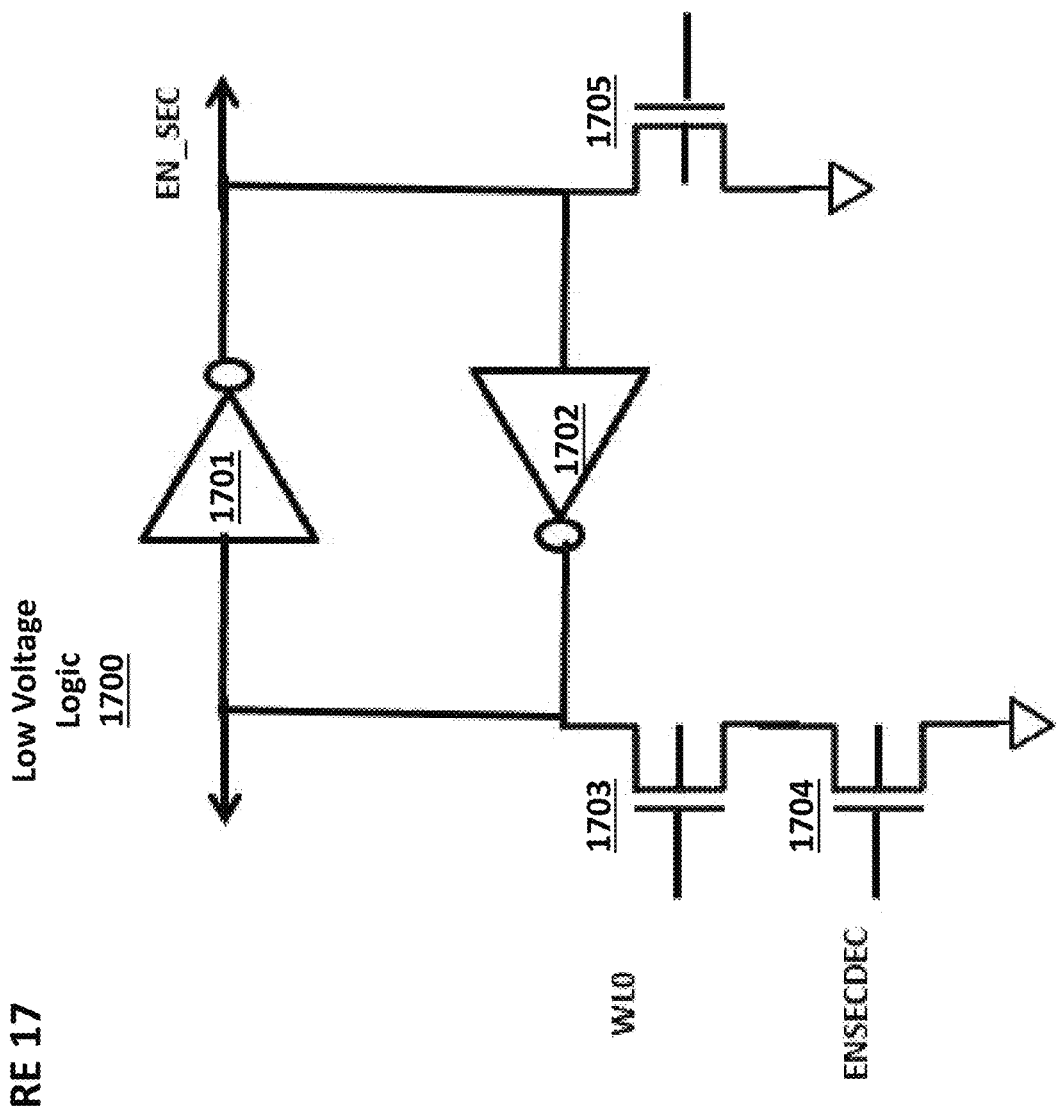
FIG. 17 depicts an embodiment of a low logic voltage circuit.

FIG. 17 depicts low voltage sector enabling latch logic 1700. Low voltage logic 1700 comprises latched inverters 1701 and 1702 and NMOS transistors 1703 (wordline enabling), 1704 (sector enabling), and 1705 (used for resetting the latched 1701/1702), all of which are constructed from transistors of type that utilize a p-well. Alternatively inverter 1701 can be constructed from transistors that utilize n-well.

Figure 18:
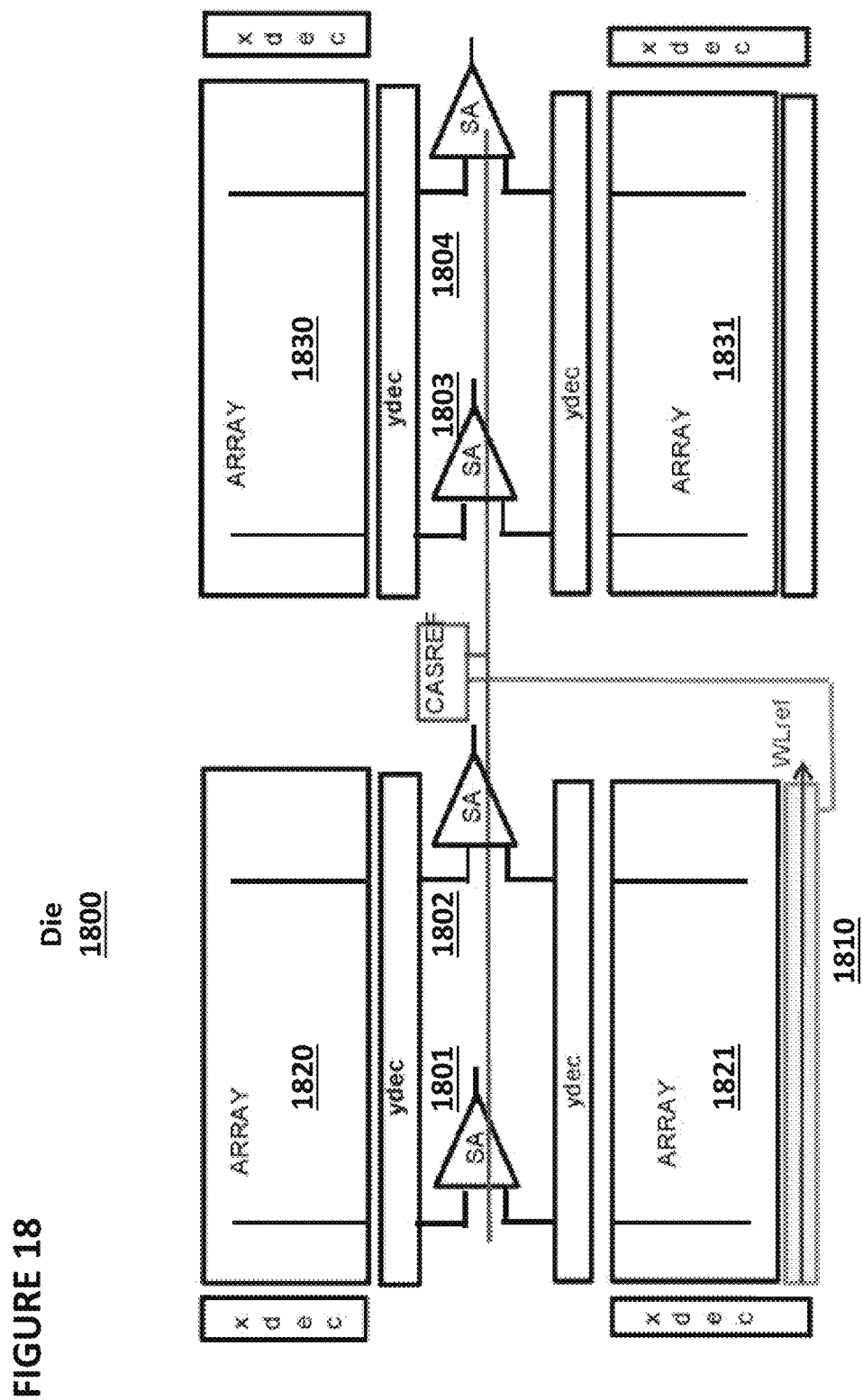
FIG. 18 depicts a sensing system which can be used for the embodiments.

FIG. 18 depicts sensing system 1800, similar to blocks 601/602/603/604 of die 600 of FIG. 6. Sensing system 1800 comprises sensing amplifiers 1801, 1802, 1803, and 1804. Embodiments of sensing amplifiers 1801, 1802, 1803, and 1804 are shown in FIGS. 19-22. A reference sector 1810 is used to generate reference bias from reference memory cell for the sensing. The two inputs of a sense amplifier couples to two bitlines of two array planes, for example the sense amplifier 1801 couples to top array plane 1820 and bottom array plane 1821. One of array plane provides a selected bitline (hence a selected memory cell through one wordline enabled) and the other array plane provides an un-selected bitline (all wordlines are disabled for this array plane) for sensing for symmetrical bitline sensing.

Figure 19:
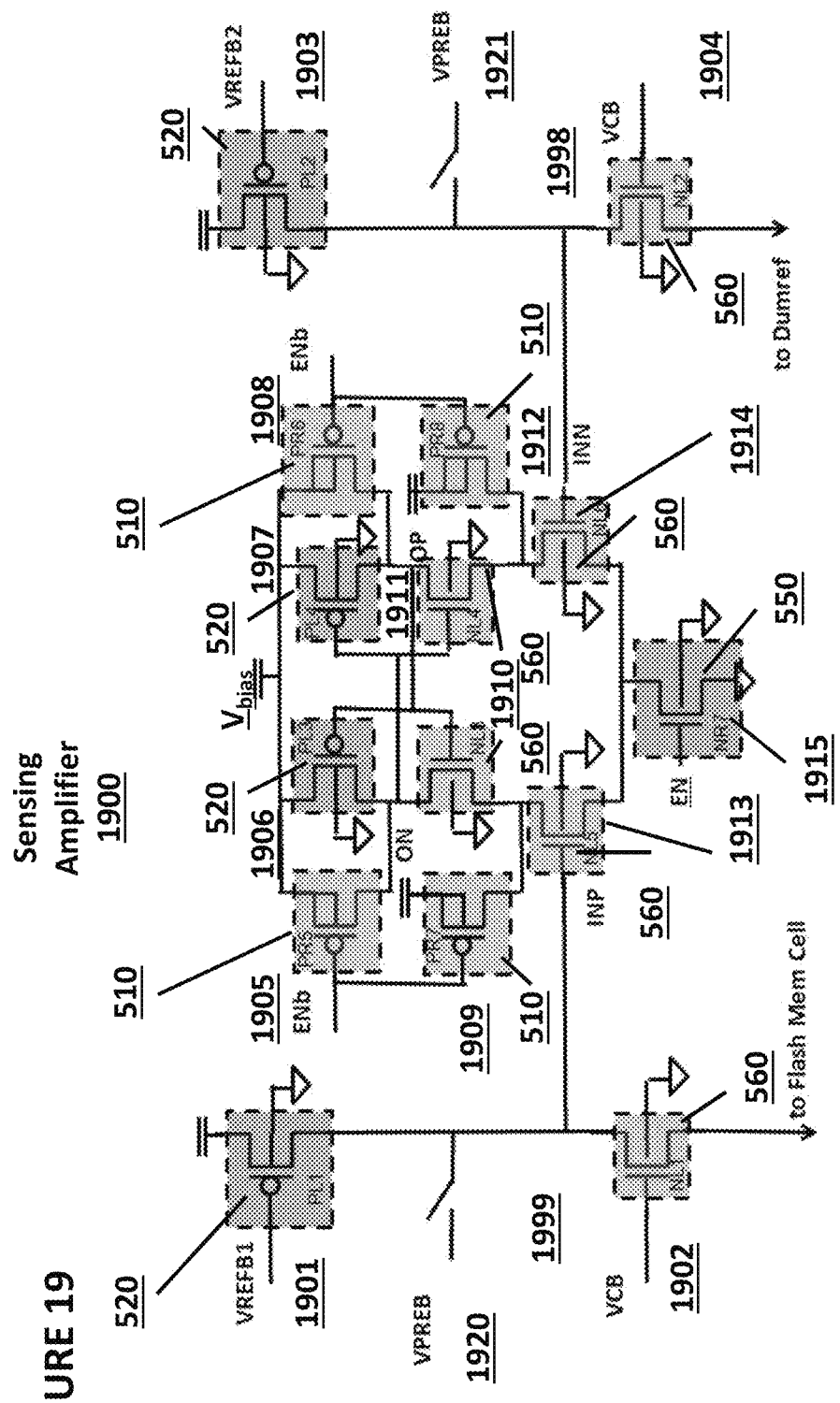
FIG. 19 depicts an embodiment of a sensing amplifier.

FIG. 19 depicts sensing amplifier 1900. Sensing amplifier 1900 comprises PMOS transistors 1901, 1906, 1907, and 1903 (of type FDSOI PMOS 520, with p-well coupled to ground), PMOS transistors 1905, 1908, 1909, and 1912 (of type FDSOI PMOS 510 with n-well coupled to $V_{bias}$), NMOS transistors 1902, 1904, 1910, 1911, 1913, and 1914 (of type FDSOI NMOS 560, with n-well coupled to ground), and NMOS transistor 1915 (of type FDSOI NMOS 550, with p-well coupled to ground). The PMOS 1901 and NMOS 1902 (and PMOS 1903 and NMOS 1904) is first (read-out) stage of the sensing amplifier. The PMOS 1901 is mirrored from a reference current Iref (such as from a reference cell in the reference sector 1810 in sensing system 1800 or a resistor). The NMOS 1902 couples to a cell current Icell through the bitline of the selected memory cell. The drain of the NMOS 1902 is sensing out node 1999 which is equal to difference between Iref and Icell times output impedance at node 1999, i.e., Vsensed=Ro*(Icell−Iref). The drain of the NMOS 1904 is a reference node 1998. The PMOS 1903 is in a disabled state with a Ileakpmos (duplicating the off state leakage of the PMOS 1901), The NMOS 1904 couples to cell current leakage Icellleak through an unselected bitline (selected bitline with all wordlines disabled) of the memory cell. The drain of the NMOS 1904 is sensing out node 1999 which is equal to difference between Ileakpmos and Icellleak times output impedance at node 1998, i.e., Vrefsen=Ro*(Icellleak−Ileakpmos). The sensing node 1999 and reference node 1998 are precharged at start of sensing to reference voltage level 1920 and 1921 respectively. The transistors 1905-1915 is second (comparison) stage of the sensing amplifier. It is a dynamic latched differential amplifier with transistor NMOS 1913 and 1914 as input pair with the sensing out node 1999 and the reference node 1998 as inputs. The transistors 1906,1907, 1910, and 1911 are latched inverters with outputs ON and OP as full voltage level (Vdd/gnd) sensing outputs after sensing the difference between the sensing out node 1999 and the reference node 1998. The PMOS transistors 1905, 1908,1909,1912 are for precharging the nodes of the latched inverters to high supply level. The NMOS 1913 and 1914 are footed input pairs (meaning connecting in series to NMOS transistors of the latched inverters). The NMOS 1915 is enabling bias transistor for the input pairs.

Figure 20:
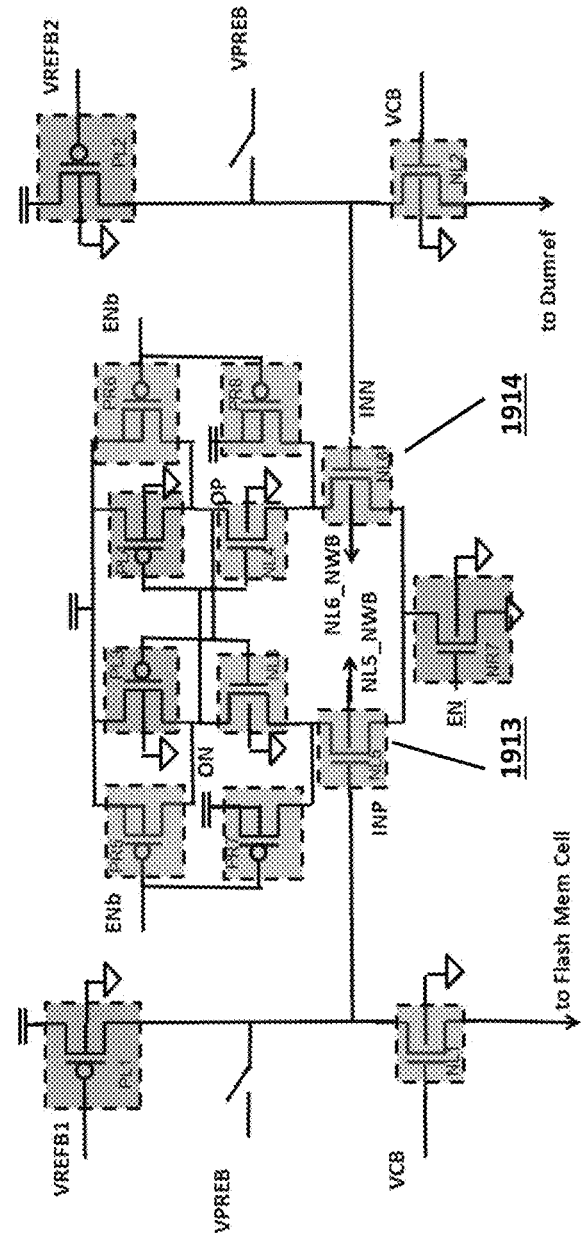
FIG. 20 depicts another embodiment of a sensing amplifier.

FIG. 20 depicts sensing amplifier 2000. Sensing amplifier 2000 is structurally identical to sensing amplifier 1900, except that the n-well of NMOS transistor 1913 is coupled to a variable voltage source, NL5_NWB, and the n-well of NMOS transistor 1914 is coupled to a variable voltage source, NL5_NWB. The variable voltage source is used to dynamically bias the well to optimize speed in active (forward body bias) and reduce leakage in standby (reverse body bias). It could also be used to nullify the threshold voltage offset of the sense amplifier.

Figure 21:
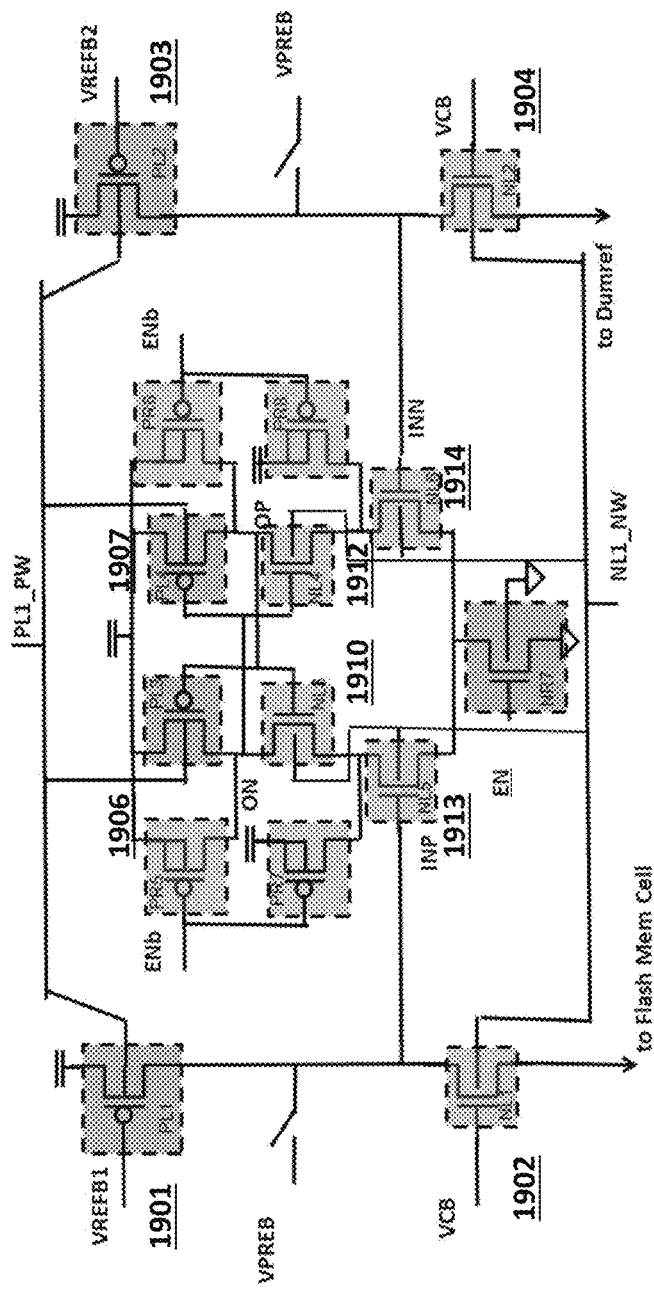
FIG. 21 depicts another embodiment of a sensing amplifier.

FIG. 21 depicts sensing amplifier 2100. Sensing amplifier 2100 is structurally identical to sensing amplifier 1900, except that the p-well of PMOS transistor 1901, 1903, 1906, and 1907 are coupled to a variable voltage source, PL1_PW, and the n-well of NMOS transistor 1902, 1904, 1910, 1911, 1913, and 1914 are coupled to a variable voltage source, NL1_NW. The variable voltage source is used to optimize speed in active (forward bias the well) and reduce leakage in standby (reverse bias the well)

Figure 22:
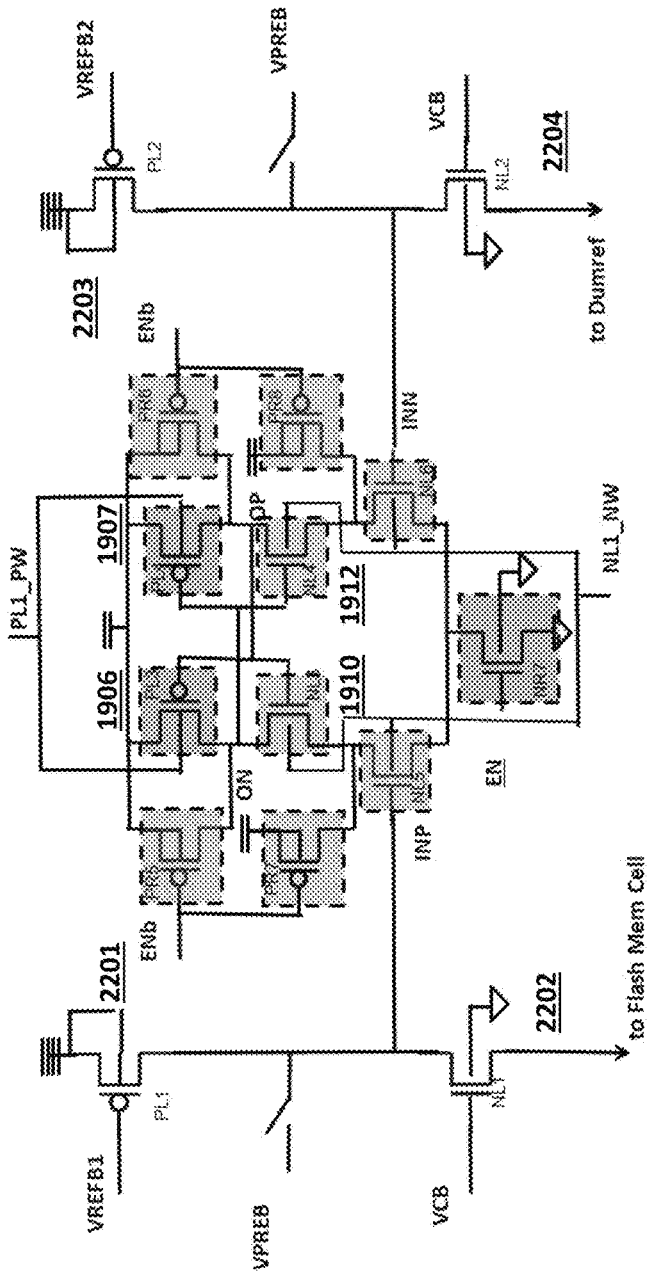
FIG. 22 depicts another embodiment of a sensing amplifier.

FIG. 22 depicts sensing amplifier 2200 with FDSOI and bulk CMOS hybrid region partition. Sensing amplifier 2200 is structurally identical to sensing amplifier 1900, except that the p-well of PMOS transistor 1906 and 1907 are coupled to a variable voltage source, PL1_PW, and the n-well of NMOS transistor 1910 and 1912 are coupled to a variable voltage source, NL1_NW and PMOS transistor 2201 and 2202 and NMOS transistors 2202 and 2204 are bulk CMOS transistors. The PMOS 2201 and NMOS 2202 and PMOS 2203 and NMOS 2204 are bulk cmos read-out stage of the amplifier. This read-out stage couples to a high supply level (due to bulk cmos transistor), for example 1.8v, instead of a logic supply level, for example Vdd1.2v for wide sensing range.

Figure 23:
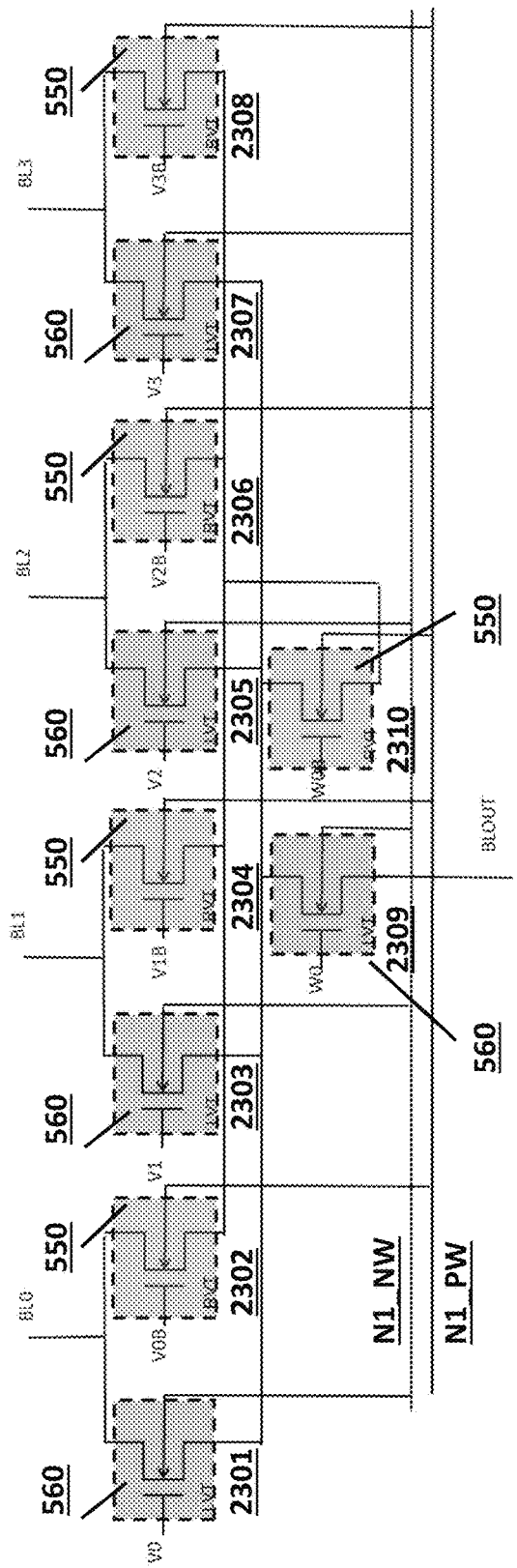
FIG. 23 depicts an embodiment of a column decoder.

FIG. 23 depicts column decoder 2300. Column decoder 2300 comprises NMOS transistors 2301, 2303, 2305, 2307, and 2309 (of type FDSOI NMOS 560, with n-well coupled to N1_NW) to enhance speed for column selection and NMOS transistors 2302, 2304, 2306, 2308, and 2310 (of type FDSOI NMOS 550, with p-well coupled to N1_PW) to reduce leakage for column de-selection.

What is claimed is:

1. A flash memory system comprising:
an array of flash memory cells; and
a sensing amplifier for reading a selected memory cell in the array of flash memory cells, the sensing amplifier comprising:
a first stage comprising a first fully depleted silicon-on-insulator PMOS transistor for providing a reference current to a sensing node, a first fully depleted silicon-on-insulator NMOS transistor coupled between the sensing node and a selected flash memory cell in the array;
a second stage comprising a second fully depleted silicon-on-insulator PMOS transistor for providing a reference current to a reference node, a second fully depleted silicon-on-insulator NMOS transistor coupled between the reference node and a reference flash memory cell; and
a differential amplifier for receiving the sensing node and the reference node as inputs and generating an output indicative of a value stored in the selected flash memory cell.

2. The flash memory system of claim 1, wherein the selected memory cell is in a first plane of the array and the reference memory cell is in a second plane of the array.

3. The flash memory system of claim 2, wherein the first plane provides a selected bitline coupled to the selected memory cell and the second plane provides another selected bitline coupled to the reference memory cell.

4. The flash memory system of claim 2, wherein a forward body bias is used in active mode and a reverse body bias is used in a standby mode for the first and second fully depleted silicon-on-insulator PMOS transistors and the first and second fully depleted silicon-on-insulator NMOS transistors.

5. The flash memory system of claim 4, wherein the forward body bias or reverse body bias is used to reduce an offset of the sense amplifier.

6. The flash memory system of claim 1, wherein the first and second fully depleted silicon-on-insulator PMOS transistors each comprises a p-well biased to ground and the first and second fully depleted silicon-on-insulator NMOS transistors each comprises an n-well biased to ground.

7. The flash memory system of claim 1, wherein the memory cells comprise source side injection flash memory cells, each comprising:
an erase gate to provide erasing;
a coupling gate; and
a source line to provide programming current.

8. The flash memory system of claim 1, wherein the first and second fully depleted silicon-on-insulator PMOS transistors each comprises a p-well coupled to a first variable voltage source and the first and second fully depleted silicon-on-insulator NMOS transistors each comprises an n-well coupled to a second variable voltage source.

9. A flash memory sensing system comprising:
an array of flash memory cells; and
a sensing amplifier for reading a selected memory cell in the array of flash memory cells, the sensing amplifier comprising:
a first stage comprising a first bulk CMOS transistor comprising a first fully depleted silicon-on-insulator PMOS transistor and a first fully depleted silicon-on-insulator NMOS transistor, wherein a sensing node is formed between the first fully depleted silicon-on-insulator PMOS transistor and the first fully depleted silicon-on-insulator NMOS transistor and the first fully depleted silicon-on-insulator NMOS transistor is coupled to a selected flash memory cell in the array;

a second stage comprising a second bulk CMOS transistor comprising a second fully depleted silicon-on-insulator PMOS transistor and a second fully depleted silicon-on-insulator NMOS transistor, wherein a reference node is formed between the second fully depleted silicon-on-insulator PMOS transistor and the second fully depleted silicon-on-insulator NMOS transistor and the second fully depleted silicon-on-insulator NMOS transistor is coupled to a reference memory cell; and a differential amplifier for receiving the sensing node and the reference node as inputs and generating an output indicative of a value stored in the selected flash memory cell.

10. The flash memory sensing system of claim 9, wherein the first fully depleted silicon-on-insulator PMOS transistor is coupled to a first power supply and the second fully depleted silicon-on-insulator PMOS transistor is coupled to a second power supply, wherein the first power supply has a higher voltage than the second power supply.

11. The flash memory sensing system of claim 9, wherein the differential amplifier comprises latched inverters.

12. The flash memory sensing system of claim 11, wherein the latched inverters are coupled to NMOS input pairs that are coupled to the sensing node.

13. A flash memory system comprising:

an array of flash memory cells arranges into rows and columns; and a row decoder for selecting a row of flash memory cells in the array for a read or write operation, the row decoder comprising one or more fully depleted silicon-on-insulator NMOS transistors, and one or more fully depleted silicon-on-insulator PMOS transistors;

a column decoder for selecting a column of flash memory cells in the array for a read or write operation, the column decoder comprising one or more fully depleted silicon-on-insulator NMOS transistors each comprising a p-well under a buried oxide layer, and one or more fully depleted silicon-on-insulator NMOS transistors each comprising an n-well under a buried oxide layer; and a sensing amplifier comprising:
  a first stage comprising a first fully depleted silicon-on-insulator PMOS transistor for providing a reference current to a sensing node, a first fully depleted silicon-on-insulator NMOS transistor coupled between the sensing node and a selected flash memory cell in the array;
  a second stage comprising a second fully depleted silicon-on-insulator PMOS transistor for providing a reference current to a reference node, a second fully depleted silicon-on-insulator NMOS transistor coupled between the reference node and a reference flash memory cell; and
  a differential amplifier for receiving the sensing node and the reference node as inputs and generating an output indicative of a value stored in the selected flash memory cell.

14. The flash memory system of claim 13, wherein each flash memory cell comprises:

an erase gate to provide erasing;

a coupling gate; and a source line to provide programming current.

15. The flash memory system of claim 13, wherein the array comprises a plurality of flash sub-arrays, each comprising separate p-wells underneath.

16. A flash memory system comprising:

an array of flash memory cells arranges into rows and columns;

a row decoder for selecting a row of flash memory cells in the array for a read or write operation, the row decoder comprising one or more fully depleted silicon-on-insulator NMOS transistors, and one or more fully depleted silicon-on-insulator PMOS transistors;

a column decoder for selecting a column of flash memory cells in the array for a read or write operation, the column decoder comprising one or more fully depleted silicon-on-insulator NMOS transistors each comprising a p-well under a buried oxide layer, and one or more fully depleted silicon-on-insulator NMOS transistors each comprising an n-well under a buried oxide layer;

a sensing amplifier for reading a selected memory cell in the array of flash memory cells, the sensing amplifier comprising one or more fully depleted silicon-on-insulator NMOS transistors, and one or more fully depleted silicon-on-insulator PMOS transistors; and a high voltage decoder comprising:
  an erase gate decoder for providing a high voltage to an erase gate terminal of a selected flash memory cell;
  a coupling gate decoder for providing a high voltage a coupling gate terminal of a selected flash memory cell; and
  a sourceline decoder for providing a high voltage to a sourceline terminal of a selected flash memory cell.

17. The flash memory system of claim 16, wherein the high voltage decoder further comprises an enabling latch comprising fully depleted silicon-on-insulator transistors.

18. The flash memory system of claim 16, wherein the erase gate decoder, the coupling gate decoder, and the source line decoder each comprises bulk CMOS transistors.

* * * * *